(12) United States Patent
Cheng et al.

(10) Patent No.: US 12,745,528 B2
(45) Date of Patent: Sep. 22, 2026

(54) ELECTRONIC DEVICE

(71) Applicant: Innolux Corporation, Miaoli County (TW)

(72) Inventors: Pai-Chiao Cheng, Miaoli County (TW); Meng-Kai Huang, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 6 days.

(21) Appl. No.: 19/008,551

(22) Filed: Jan. 2, 2025

(65) Prior Publication Data

US 2025/0151554 A1 May 8, 2025

Related U.S. Application Data

(63) Continuation of application No. 18/337,055, filed on Jun. 19, 2023, now Pat. No. 12,245,480, which is a continuation of application No. 17/159,155, filed on Jan. 27, 2021, now Pat. No. 11,730,027.

(30) Foreign Application Priority Data

Feb. 27, 2020 (CN) ......................... 202010124681.8

(51) Int. Cl.

| | |
|---|---|
| ***H10K 59/179*** | (2023.01) |
| ***H10K 59/12*** | (2023.01) |
| ***H10K 59/131*** | (2023.01) |
| ***H10K 59/80*** | (2023.01) |
| *H10K 59/10* | (2023.01) |

(52) U.S. Cl.

CPC ........... *H10K 59/179* (2023.02); *H10K 59/12* (2023.02); *H10K 59/131* (2023.02); *H10K 59/8731* (2023.02); *H10K 59/10* (2023.02)

(58) Field of Classification Search

CPC .... H10K 59/179; H10K 59/12; H10K 59/131; H10K 59/8731; H10K 59/10

See application file for complete search history.

(56) References Cited

U.S. PATENT DOCUMENTS

2017/0323936 A1* 11/2017 Lee .................... H10K 59/8731

* cited by examiner

*Primary Examiner* — Adam R. Giesy

(74) *Attorney, Agent, or Firm* — JCIPRNET

(57) ABSTRACT

An electronic device has a peripheral region and includes a substrate, a first metal layer, and a protrusion structure. The first metal layer is disposed on the substrate and comprises a first portion and a second portion. The protrusion structure is disposed on the substrate and in the peripheral region. The first portion is not overlapped with the protrusion structure, the second portion is overlapped with the protrusion structure, and an end of the second portion is located in the protrusion structure and higher than the first portion in a normal direction of the substrate.

9 Claims, 15 Drawing Sheets

1B

ELECTRONIC DEVICE

CROSS-REFERENCE TO RELATED APPLICATION

This application is a continuation application of and claims the priority benefit of U.S. application Ser. No. 18/337,055, filed on Jun. 19, 2023. The prior U.S. application Ser. No. 18/337,055 is a continuation application of and claims the priority benefit of U.S. application Ser. No. 17/159,155, filed on Jan. 27, 2021, which claims the priority benefit of China application serial no. 202010124681.8, filed on Feb. 27, 2020. The entirety of each of the above-mentioned patent applications is hereby incorporated by reference herein and made a part of this specification.

BACKGROUND

Technical Field

The disclosure relates to an electronic device, and more particularly, to an electronic device including a protrusion structure.

Description of Related Art

If metal traces extending to the peripheral region of an electronic device are not properly protected, they are likely to be corroded under the reaction of moisture or oxygen, thereby affecting the electrical performance of the elements in the electronic device or the display quality of the electronic device. Therefore, how to provide the metal traces in the peripheral region with proper protection has become one of the research focuses of researchers in the field.

SUMMARY

The disclosure provides an electronic device capable of having good display quality or electrical performance.

According to an embodiment of the disclosure, the electronic device has a peripheral region and includes a substrate, a first metal layer, and a protrusion structure. The first metal layer is disposed on the substrate. The protrusion structure is disposed on the substrate and in the peripheral region. The first metal layer extends into and ends in the protrusion structure.

Based on the above, in the embodiments of the disclosure, the first metal layer extends into and ends in the protrusion structure. With the proper protection provided by the protrusion structure to the first metal layer, the corrosion probability of the first metal layer is reduced. Therefore, the electronic device of the disclosure is capable of having good display quality or electrical performance.

In order to make the aforementioned features and advantages of the disclosure comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 2A to FIG. 8A are enlarged views of the protrusion structures in FIG. 2 to FIG. 8 respectively.

FIG. 2B to FIG. 8B are enlarged views of the inner protrusion structures in FIG. 2 to FIG. 8 respectively.

DESCRIPTION OF THE EMBODIMENTS

Figure 1:
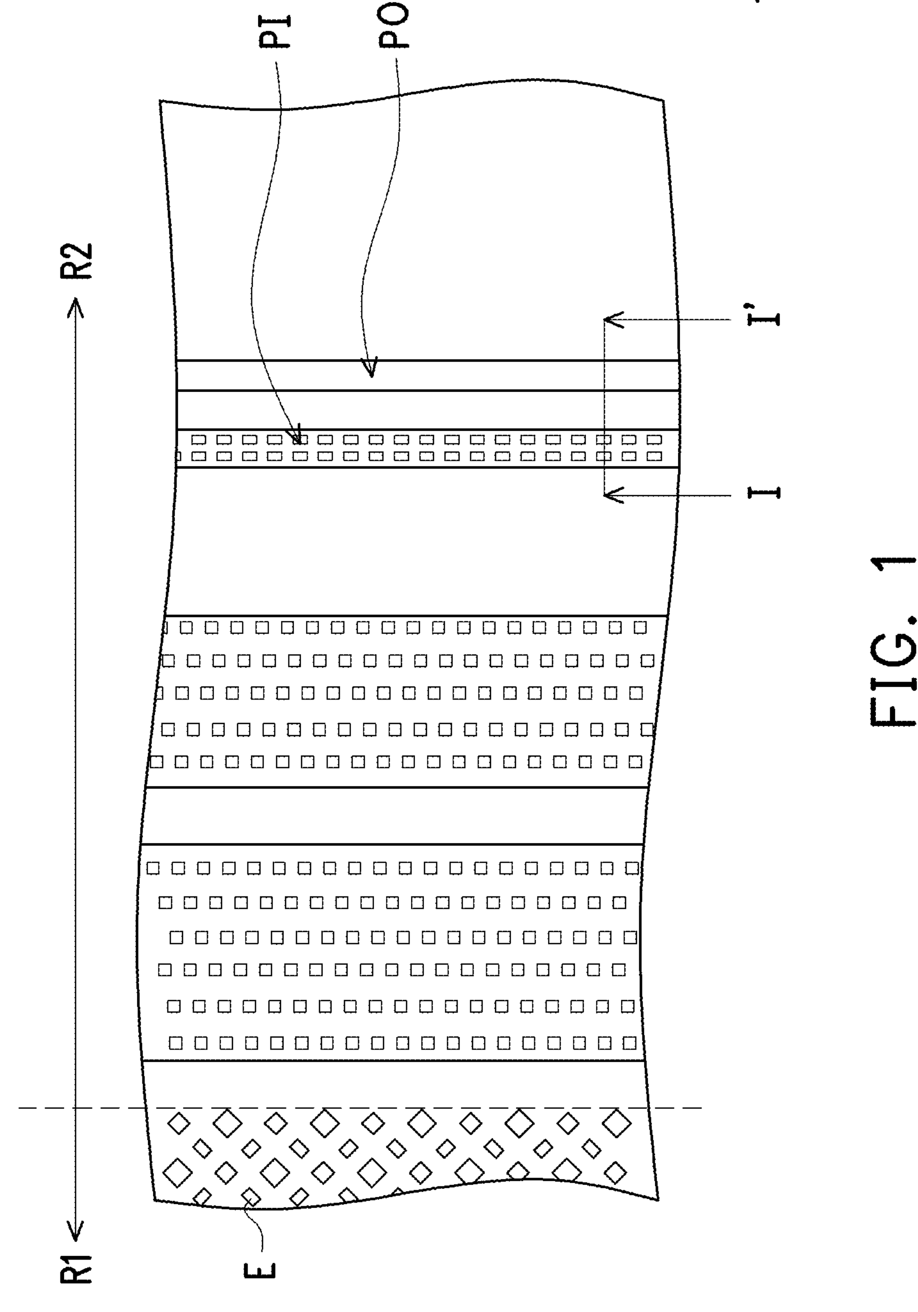
FIG. 1 is a schematic top view of part of an electronic device according to an embodiment of the disclosure.

The disclosure may be understood by referring to the following detailed description with reference to the accompanying drawings. It is noted that for comprehension of the reader and simplicity of the drawings, in the drawings of the disclosure, only a part of the electronic device/display device is shown, and specific components in the drawings are not necessarily drawn to scale. Moreover, the quantity and the size of each component in the drawings are only schematic and are not intended to limit the scope of the disclosure. For example, the relative size and thickness and location of layers, regions, and/or structures may be reduced or enlarged for clarity.

Throughout the specification and the appended claims of the disclosure, certain terms are used to refer to specific components. Those skilled in the art should understand that electronic device manufacturers may probably use different names to refer to the same components. This specification is not intended to distinguish between components that have the same function but different names. In the following specification and claims, the terms "including", "containing", "having", etc., are open-ended terms, so they should be interpreted to mean "including but not limited to . . . ".

In the following embodiments, wordings used to indicate directions, such as "up," "down," "front," "back," "left," and "right," merely refer to directions in the accompanying drawings. Therefore, the directional wordings are used to illustrate rather than limit the disclosure. It should be understood that when a component or a film layer is described as being "on" or "connected to" another component or film layer, it may be directly on or connected to the another component or film layer, or there is an intervening component or film layer therebetween (an indirect situation). When a component is described as being "directly on" or "directly connected" to another component or film layer, there is no intervening component or film layer therebetween.

The terms such as "about", "equal", "same", "substantially", or "approximately" are generally interpreted as being within a range of plus or minus 10% of a given value or range, or as being within a range of plus or minus 5%, plus or minus 3%, plus or minus 2%, plus or minus 1%, or plus or minus 0.5% of the given value or range. In addition, the term "a given range is between the first value and the second value" or the term "a given value falls in the range between the first value and the second value", both mean the given range includes the first value, the second value, and values between the two values.

In some embodiments of the disclosure, terms such as "connect" and "interconnect" with respect to bonding and connection, unless specifically defined, may refer to two structures that are in direct contact with each other, or may refer to two structures that are indirectly in contact with each other, wherein there are other structures set between these two structures. In addition, the terms that describe joining and connecting may apply to the case where both structures are movable or both structures are fixed. In addition, the term "electrically connected" or "coupling" involves any direct and indirect electrical connection means.

The electronic device in the disclosure may include a display device, an antenna device, a sensing device, a light-emitting device, or a tiling device, but the disclosure is not limited thereto. The electronic device may be a bendable or flexible electronic device. The electronic device may, for example, include liquid crystals, light-emitting diodes (LEDs), or quantum dots (QDs). The light-emitting diodes may include, for example, organic light-emitting diodes (OLEDs), mini LEDs, micro LEDs, or quantum dot light-emitting diodes (QLEDs, QDLEDs), fluorescence, phosphors, other suitable materials, or a combination thereof, but the disclosure is not limited thereto. A display device is configured as an electronic device to illustrate the content of the disclosure in the following, but the disclosure is not limited thereto.

The display device of the disclosure may be any type of display device, such as a self-luminous display device or a non-self-luminous display device. The self-luminous display device may include light-emitting diodes, a light conversion layer, other suitable materials, or a combination thereof, but the disclosure is not limited thereto. The light conversion layer may include a wavelength conversion material and/or a light filtering material. The light conversion layer may include, for example, fluorescence, phosphors, quantum dots, other suitable materials, or a combination thereof, but the disclosure is not limited thereto. The non-self-luminous display device may include liquid crystals, but the disclosure is not limited thereto. An organic light-emitting diode (OLED) display device is configured as a display device to illustrate the content of the disclosure in the following, but the disclosure is not limited thereto.

FIG. 1 is a schematic top view of part of an electronic device according to an embodiment of the disclosure. Referring to FIG. 1, an electronic device 1 has a display region R1 and a peripheral region R2. The peripheral region R2 is located on at least one side of the display region R1. For example, the peripheral region R2 may be located on one or multiple sides of the display region R1. Taking an organic light-emitting diode (OLED) display device as an example, a plurality of organic light-emitting diodes (OLEDs) E may be disposed in the display region R1 of the electronic device 1. The plurality of OLEDs E are arranged in an array to provide display images. In some embodiments, the display region R1 may be defined as a region displaying images. In detail, the display region R1 is a region defined by the connection of the outermost ends of the OLEDs E disposed at the edge (shown as the dotted line in FIG. 1). A plurality of metal traces (not shown) in the electronic device 1 extend from the display region R1 into the peripheral region R2. The plurality of OLEDs E are electrically connected to external circuits through the plurality of metal traces. A plurality of protrusion structures (e.g., a protrusion structure PI and a protrusion structure PO) are disposed in the peripheral region R2 of the electronic device 1. The plurality of the protrusion structures may serve as a barrier for the filling materials in the electronic device 1 to reduce the probability of the filling materials overflowing during packaging. The protrusion structure PI is located between the protrusion structure PO and the display region R1. In the following embodiments, for ease of description, the protrusion structure PI closer to the display region R1 of the electronic device 1 is referred to as an inner protrusion structure, and the protrusion structure PO farther from the display region R1 of the electronic device 1 is referred to as a protrusion structure.

The seven embodiments of the electronic device in the disclosure are illustrated with reference to FIG. 2 to FIG. 8B in below. However, note that the seven embodiments are only for illustration and are not intended to limit the implemented embodiments of the electronic device in the disclosure. In the following embodiments, the same or similar elements will be designated by the same or similar reference numerals, and descriptions thereof will be omitted. In addition, the terms such as "first" and "second" mentioned in the specification or the claims are only used to name discrete elements or to distinguish different embodiments or scopes and are not intended to limit the upper or lower limit of the number of the elements, nor are they intended to limit the manufacturing order or disposition order of the elements.

FIG. 2 to FIG. 8 are respectively seven cross-sectional schematic views of the section I-I' in FIG. 1. The seven cross-sectional schematic views schematically illustrate the details of the protrusion structure and the inner protrusion structure in the peripheral region of the electronic device respectively. FIG. 2A to FIG. 8A are enlarged views of the protrusion structures in FIG. 2 to FIG. 8 respectively. FIG. 2B to FIG. 8B are enlarged views of the inner protrusion structures in FIG. 2 to FIG. 8 respectively.

Figure 2:
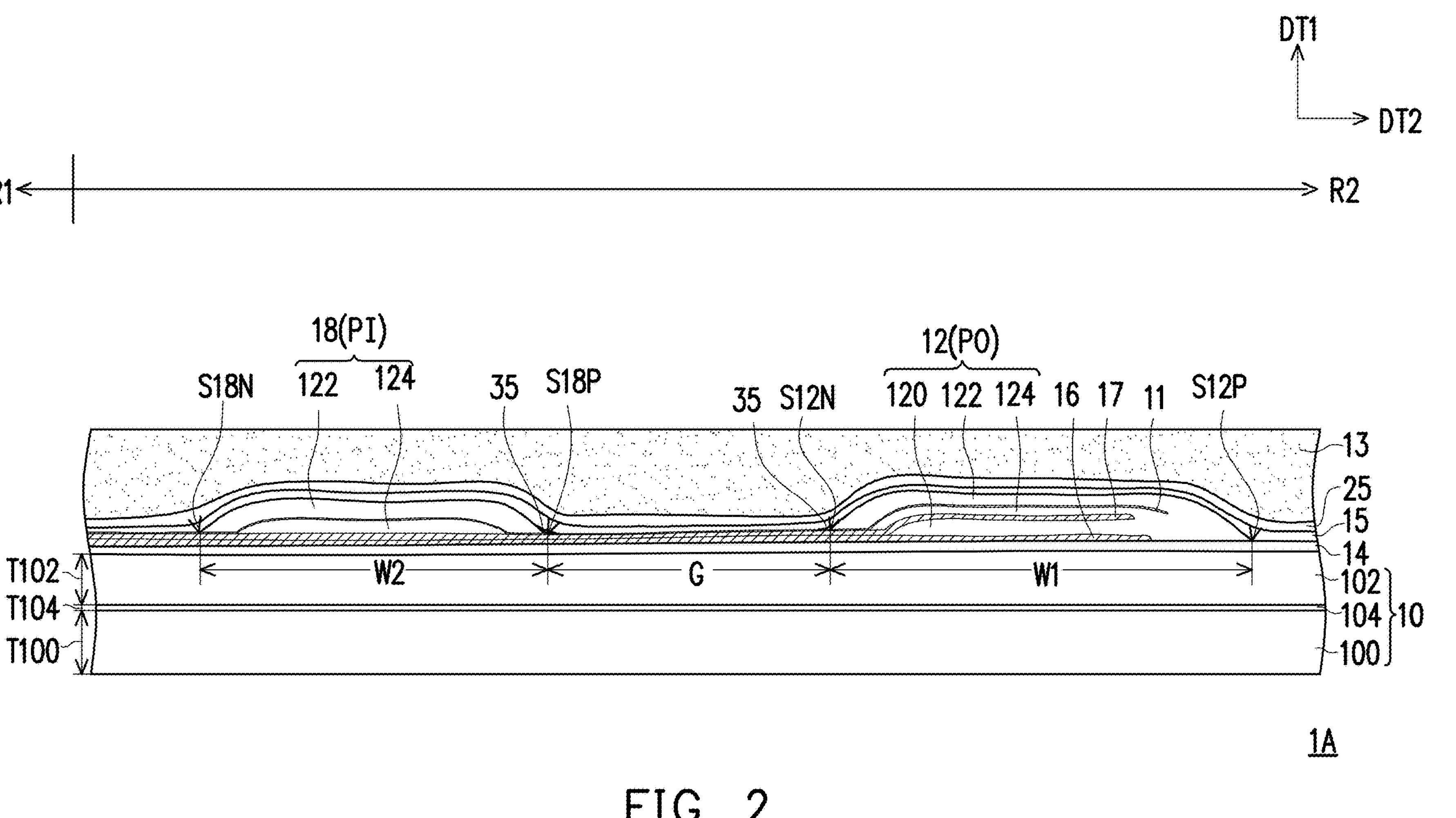
FIG. 2 to FIG. 8 are respectively seven cross-sectional schematic views of the section I-I' in FIG. 1.
Figure 2A:
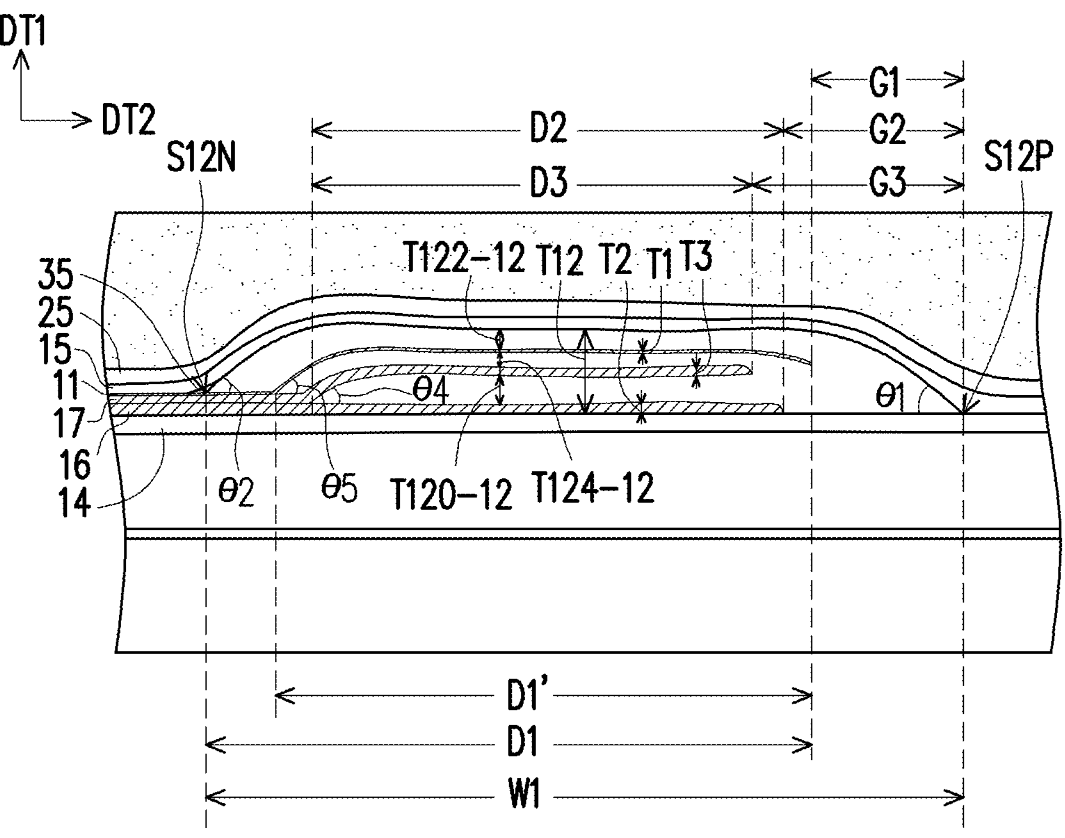
Figure 2B:
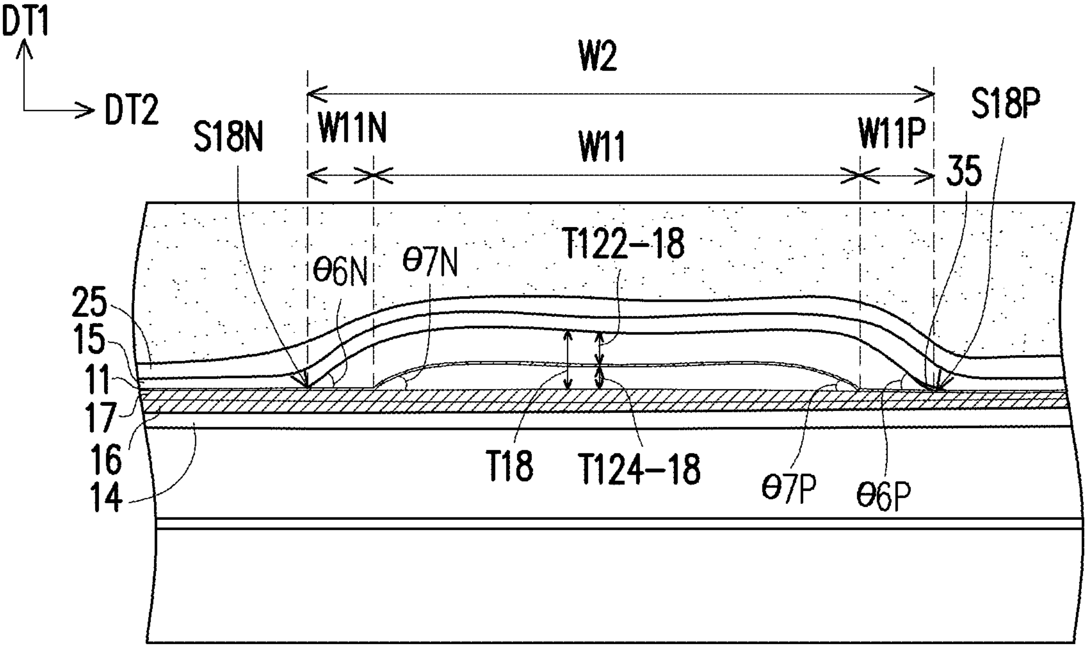

Referring to FIG. 2, FIG. 2A, and FIG. 2B, an electronic device 1A includes a substrate 10, a first metal layer 11 disposed on the substrate 10, and a protrusion structure 12 disposed on the substrate 10 and located in the peripheral region R2.

The substrate 10 carries the first metal layer 11 and the protrusion structure 12. In some embodiments, the substrate 10 may include a rigid substrate or a flexible substrate. In some embodiments, the substrate 10 may include a light-transmitting substrate or a non-light-transmitting substrate. In some embodiments, the substrate 10 may be a single-layered substrate or a composite substrate.

In the embodiment, the substrate 10 includes, for example, a first substrate 100, a second substrate 102, and an intermediate layer 104. The second substrate 102 is located between the first metal layer 11 and the first substrate 100, and the intermediate layer 104 is located between the first substrate 100 and the second substrate 102. The material of the first substrate 100 and the second substrate 102 includes, for example, a flexible material, such as polyimide (PI). The material of the intermediate layer 104 includes, for example, silicon oxide or silicon nitride. In some embodiments, a thickness T100 of the first substrate 100 may range from 3 μm to 15 μm (3 μm≤thickness T100≤15 μm), a thickness T102 of the second substrate 102 may range from 3 μm to 11 μm (3 μm≤thickness T102≤11 μm), a thickness T104 of the intermediate layer 104 may range from 0.3 μm to 2 μm (0.3 μm≤thickness T104≤2 μm), but the disclosure is not limited thereto. In the embodiment, the thickness T100 of the first substrate 100, the thickness T102 of the second substrate 102, and the thickness T104 of the intermediate layer 104 are, for example, 5.5 μm, 5.1 μm, and 0.6 μm in the order. In the specification, the thickness of the film layer refers to the maximum thickness of the film layer in the normal direction DT1 (or the thickness direction) of the substrate 10. However, the number, type, stacking sequence, material, thickness, etc. of the film layers of the substrate 10 may be changed according to requirements, and the disclosure is not limited thereto. In some embodiments, the thickness T102 of the second substrate 102 may be less than or equal to the thickness T100 of the first substrate 100.

The first metal layer 11 is adapted to transmit signals. Taking an OLED display device as an example, the first metal layer 11 may be a patterned metal layer. For example, the first metal layer 11 may include a plurality of bottom electrodes (not shown) of the plurality of OLEDs E located in the display region R1 (see FIG. 1), but the disclosure is not limited thereto. The first metal layer 11 may be a single metal layer or a stack of metal layers. In some embodiments, the thickness of the first metal layer 11 may range from 50 nm to 150 nm (50 nm≤the thickness of the first metal layer 11≤150 nm), or from 70 nm to 110 nm (70 nm≤the thickness of the first metal layer 11≤110 nm), but the disclosure is not limited thereto. In the embodiment, the first metal layer 11 includes, for example, three conductive layers. The three conductive layers are sequentially formed on the substrate 10 along the normal direction DT1 of the substrate 10. The materials of the three conductive layers are, for example, molybdenum, aluminum, and molybdenum in the order or titanium, aluminum, and titanium in the order. In addition, the thicknesses of the three conductive layers are, for example, 3.5 nm, 77.2 nm, and 5.8 nm in the order. In some embodiments, the thicknesses of the three conductive layers of the first metal layer 11 are respectively the maximum thickness in the normal direction DT1, and a relatively flat portion of the first metal layer 11 may be selected for measurement. However, the number, type, stacking sequence, material or thickness of the film layers of the first metal layer 11 may be changed according to requirements, and the disclosure is not limited thereto.

The first metal layer 11 extends into and ends in the protrusion structure 12. As shown in FIG. 2, the first metal layer 11 extends into the protrusion structure 12, for example, from the inside (e.g., the display region R1) of the substrate 10 toward the edge (e.g., the peripheral region R2) of the substrate 10, and a side of the first metal layer 11 closer to the edge of the substrate 10 is located in the protrusion structure 12 and may have a distance from the outer edge S12P of the protrusion structure 12.

The protrusion structure 12 may include at least one organic insulating layer. In the embodiment of the disclosure, the protrusion structure 12 is capable of providing the first metal layer 11 with proper protection and reduces the corrosion probability of the first metal layer 11, and the electronic device 1A may have good display quality or electrical performance. If the first metal layer 11 extending into the protrusion structure 12 is too close to the outer edge S12P of the protrusion structure 12, the corrosion probability of the first metal layer 11 may be increased. Conversely, if the first metal layer 11 extending into the protrusion structure 12 is too close to the inner edge S12N of the protrusion structure 12, the protection may be insufficient due to positioning errors. In some embodiments (see FIG. 2A), a width W1 of the protrusion structure 12 and the distance G1 between the first metal layer 11 and the outer edge S12P of the protrusion structure 12 may satisfy the relationship of $0.1 \leq G1/W1 \leq 0.9$ to improve the protection provided by the protrusion structure 12 to the first metal layer 11. In some embodiments, under any cross section of the protrusion structure 12 in the normal direction DT1 of the substrate 10, the width W1 is defined as the maximum width of the protrusion structure 12 in the direction DT2, and the distance G1 is defined as the maximum distance between the first metal layer 11 and the outer edge S12P of the protrusion structure 12 in the direction DT2. The direction DT2 is perpendicular to the normal direction DT1 of the substrate 10.

According to different requirements, the electronic device 1A may also include other elements or film layers. In the embodiment, the electronic device 1A further includes a first inorganic insulating layer 14, a second inorganic insulating layer 15, an inorganic insulating layer 25, an organic insulating layer 35, a second metal layer 16, and a third metal layer 17. In addition, the protrusion structure 12 includes a first organic insulating layer 120, a second organic insulating layer 122, and a third organic insulating layer 124.

The first inorganic insulating layer 14, the second metal layer 16, the first organic insulating layer 120, the third metal layer 17, the third organic insulating layer 124, the first metal layer 11, the second organic insulating layer 122, and the second inorganic insulating layer 15 are, for example, sequentially disposed on the substrate 10. The first inorganic insulating layer 14 is located between the first organic insulating layer 120 and the substrate 10. The second metal layer 16 is located between the first inorganic insulating layer 14 and the first organic insulating layer 120. The first organic insulating layer 120 is located between the second metal layer 16 and the third metal layer 17. The third metal layer 17 is located between the first organic insulating layer 120 and the third organic insulating layer 124. The third organic insulating layer 124 is located between the third metal layer 17 and the first metal layer 11. The first metal layer 11 is located between the third organic insulating layer 124 and the second organic insulating layer 122. The second organic insulating layer 122 is located between the first metal layer 11 and the second inorganic insulating layer 15. The second inorganic insulating layer 15 is disposed on the second organic insulating layer 122 and the first inorganic insulating layer 14. The protrusion structure 12 is located between the second inorganic insulating layer 15 and the first inorganic insulating layer 14.

The first organic insulating layer 120, the second organic insulating layer 122, and the third organic insulating layer 124 may include the same or different materials. For example, the materials of the first organic insulating layer 120, the second organic insulating layer 122, and the third organic insulating layer 124 may include acrylic resin or photosensitive resin, but the disclosure is not limited thereto. In the embodiment, the first organic insulating layer 120, the second organic insulating layer 122, and the third organic insulating layer 124 include, for example, the same or similar materials, so there may be no interface among the first organic insulating layer 120, the second organic insulating layer 122, and the third organic insulating layer 124. Since moisture and oxygen may invade along the interface between different materials, the first metal layer 11 extending into the protrusion structure 12 is surrounded by the second organic insulating layer 122 and the third organic insulating layer 124 include the same or similar material, and the third metal layer 17 extending into the protrusion structure 12 is surrounded by the first organic insulating layer 120 and the third organic insulating layer 124 include the same or similar material, so that the corrosion probability of the first metal layer 11 and the third metal layer 17 may be reduced.

The first inorganic insulating layer 14 and the second inorganic insulating layer 15 may include the same or different materials. For example, the material of the first inorganic insulating layer 14 and the second inorganic insulating layer 15 may include oxide or nitride, but the disclosure is not limited thereto. Since the inorganic insulating layer has a better ability in blocking moisture and oxygen than the organic insulating layer, surrounding the protrusion structure 12 with the second inorganic insulating layer 15 and the first inorganic insulating layer 14 may improve the effect of blocking moisture and oxygen, thereby reducing the corrosion probability of the metal layers (including the first metal layer 11, the second metal layer 16, and the third metal layer 17). In some embodiments, the first inorganic insulating layer 14 and the second inorganic insulating layer 15 may include the same or similar materials, so there may be no interface between the first inorganic insulating layer 14 and the second inorganic insulating layer 15, and thereby the corrosion probability of the metal layers due to moisture and oxygen invading the protrusion structure 12 from between the first inorganic insulating layer 14 and the second inorganic insulating layer 15 may be reduced. In some embodiments, at least one of the first inorganic insulating layer 14 and the second inorganic insulating layer 15 may be a stack of multiple inorganic insulating layers.

The second metal layer 16 is adapted to transmit signals. Taking an OLED display device as an example, the second metal layer 16 may be a patterned metal layer. For example, the second metal layer 16 may include a plurality of data lines (not shown) located in the display region R1 (see FIG. 1), and a plurality of sources and a plurality of drains of a plurality of active elements (not shown). However, the disclosure is not limited thereto. The second metal layer 16 may be a single metal layer or a stack of metal layers. In some embodiments, the thickness of the second metal layer 16 may range from 350 nm to 900 nm (350 nmSthe thickness of the second metal layer 16≤900 nm), or from 450 nm to 830 nm (450 nmSthe thickness of the second metal layer 16≤830 nm), but the disclosure is not limited thereto. In the embodiment, the second metal layer 16 includes, for example, three conductive layers. The three conductive layers are sequentially formed on the substrate 10 along the normal direction DT1 of the substrate 10. The materials of the three conductive layers are, for example, molybdenum, aluminum, and molybdenum in the order or titanium, aluminum, and titanium in the order. In addition, the thicknesses of the three conductive layers are, for example, 102.7 nm, 609.4 nm, and 54.7 nm in the order. In some embodiments, the thicknesses of the three conductive layers of the second metal layer 16 are respectively the maximum thickness in the normal direction DT1, and a relatively flat portion may be selected for measurement. However, the number, type, stacking sequence, material or thickness of the film layers of the second metal layer 16 may be changed according to requirements, and the disclosure is not limited thereto. In some embodiments, the thickness T2 of the second metal layer 16 may be greater than the thickness T1 of the first metal layer 11 to reduce impedance or improve the performance of signal transmission.

The second metal layer 16 extends into and ends in the protrusion structure 12. As shown in FIG. 2 and FIG. 2A, the second metal layer 16 extends into the protrusion structure 12, for example, from the inside (e.g., the display region R1) of the substrate 10 toward the edge (e.g., the peripheral region R2) of the substrate 10, one side of the second metal layer 16 close to the edge of the substrate 10 is located in the protrusion structure 12, and the second metal layer 16 has a distance G2 from the outer edge S12P of the protrusion structure 12. The interface between different materials is susceptible to the intrusion of moisture and oxygen, and the second metal layer 16 is disposed between the first inorganic insulating layer 14 and the first organic insulating layer 120 include different materials, so compared to the first metal layer 11, the second metal layer 16 is farther away from the outer edge S12P of the protrusion structure 12 (i.e., G2 is greater than G1) to improve the protection (the effect of blocking moisture and oxygen) of the second metal layer 16.

The third metal layer 17 is adapted to transmit signals, and the configuration of the third metal layer 17 contributes to improving the flexibility or elasticity of circuit design. Taking an OLED display device as an example, the third metal layer 17 may be a patterned metal layer. For example, the third metal layer 17 may include circuits for specific functions, such as reference signal lines, power lines, or ground lines, but the disclosure is not limited thereto. The third metal layer 17 may be a single metal layer or a stack of metal layers. In some embodiments, the thickness of the third metal layer 17 may range from 550 nm to 850 nm (550 nm≤the thickness of the third metal layer 17≤850 nm), or from 650 nm to 800 nm (650 nm≤the thickness of the third metal layer 17≤800 nm), but the disclosure is not limited thereto. In the embodiment, the third metal layer 17 includes, for example, three conductive layers. The three conductive layers are sequentially formed on the substrate 10 along the normal direction DT1 of the substrate 10. The materials of the three conductive layers are, for example, molybdenum, aluminum, and molybdenum in the order or titanium, aluminum, and titanium in the order. In addition, the thicknesses of the three conductive layers are, for example, 68.4 nm, 561.5 nm, and 44.5 nm in the order. In some embodiments, the thicknesses of the three conductive layers of the third metal layer 17 are respectively the maximum thickness in the normal direction DT1, and a relatively flat portion may be selected for measurement. However, the number, type, stacking sequence, material or thickness of the film layers of the third metal layer 17 may be changed according to requirements, and the disclosure is not limited thereto. In some embodiments, the thickness T3 of the third metal layer 17 may be greater than the thickness T1 of the first metal layer 11 to reduce impedance or improve the performance of signal transmission.

The third metal layer 17 extends into and ends in the protrusion structure 12. As shown in FIG. 2 and FIG. 2A, the third metal layer 17 extends into the protrusion structure 12, for example, from the inside (e.g. the display region R1) of the substrate 10 toward the edge (e.g., the peripheral region R2) of the substrate 10, and a side of the third metal layer 17 closer to the edge of the substrate 10 is located in the protrusion structure 12 and may have a distance G3 from the outer edge S12P of the protrusion structure 12. In the embodiment, G3 is greater than G1, but the disclosure is not limited thereto.

The electronic device 1A may further include an inner protrusion structure 18. The inner protrusion structure 18 is disposed on the substrate 10 and located in the peripheral region R2. The protrusion structure 12 is closer to the edge of the substrate 10 than the inner protrusion structure 18, and the protrusion structure 12 may have a distance G from the inner protrusion structure 18. The inner protrusion structure 18 further includes at least one organic insulating layer. In the embodiment, the inner protrusion structure 18 includes, for example, the second organic insulating layer 122 and the third organic insulating layer 124, but the disclosure is not limited thereto. The first metal layer 11, the second metal layer 16, and the third metal layer 17 are located between the second inorganic insulating layer 15 and the first inorganic insulating layer 14. As shown in FIG. 2, the first metal layer 11 is in contact with the third metal layer 17 between the protrusion structure 12 and the inner protrusion structure 18, and the third metal layer 17 is in contact with the second metal layer 16 between the protrusion structure 12 and the inner protrusion structure 18. In the inner protrusion structure 18, the second metal layer 16 and the third metal layer 17 are in contact, the first metal layer 11 and the third metal layer 17 are partially separated by the third organic insulating layer 124, and the first metal layer 11 is located between the second organic insulating layer 122 and the third organic insulating layer 124.

The related parameters of each film layer in FIG. 2, FIG. 2A, and FIG. 2B are listed in Table 1. However, note that the values in Table 1 only represents an embodiment under the framework of FIG. 2, and simple equivalent changes and modifications made in accordance with the specification or claims still fall within the scope of the disclosure.

The related parameters in Table 1 are illustrated as follows:

W1: the maximum distance of the orthographic projection of the protrusion structure 12 on the substrate 10 in the direction DT2. In some embodiments, W1 may range from 40 μm to 80 μm (40 μm≤W1≤80 μm), or from 50 μm to 70 μm (50 μm≤W1≤70 μm), but the disclosure is not limited thereto.

D1: the maximum distance of the orthographic projection of the first metal layer 11 overlapping the protrusion structure 12 on the substrate 10 in the direction DT2, which is also the maximum distance between the end of the first metal layer 11 close to the outer edge S12P and the inner edge S12N of the protrusion structure 12 in the direction DT2. In some embodiments, D1 may range from 5 μm to 50 μm (5 μm≤D1≤50 μm), or from 10 μm to 45 μm (10 μm≤D1≤45 μm), but the disclosure is not limited thereto.

D1': the maximum distance of the orthographic projection of the first metal layer 11 on the substrate 10 in the direction DT2 (the first metal layer 11 is between the second organic insulating layer 122 and the third organic insulating layer 124 in the protrusion structure 12), which is also the maximum distance of the orthographic projection of the first metal layer 11 that is not in contact with the third metal layer 17 in the protrusion structure 12 on the substrate 10 in the direction DT2. In some embodiments, D1' may range from 5 μm to 50 μm (5 μm≤D1'≤50 μm), or from 10 μm to 40 μm (10 μm≤D1'≤40 μm), but the disclosure is not limited thereto.

D2: the maximum distance of the orthographic projection of the second metal layer 16 that is not in contact with the third metal layer 17 in the protrusion structure 12 on the substrate 10 in the direction DT2. In some embodiments, D2 may range from 5 μm to 50 μm (5 μm≤D2≤50 μm), or from 10 μm to 40 μm (10 μm≤D2≤40 μm), but the disclosure is not limited thereto.

D3: the maximum distance of the orthographic projection of the third metal layer 17 that is not in contact with the second metal layer 16 in the protrusion structure 12 on the substrate 10 in the direction DT2. In some embodiments, D3 may range from 2 μm to 40 μm (2 μm≤D3≤40 μm), or from 5 μm to 35 μm (5 μm≤D3≤35 μm), but the disclosure is not limited thereto.

G1: the maximum distance between the end of the first metal layer 11 close to the outer edge S12P and the outer edge S12P of the protrusion structure 12 in the direction DT2. In some embodiments, G1 may range from 5 μm to 60 μm (5 μm≤G1≤60 μm), or from 10 μm to 50 μm (10 μm≤G1≤50 μm), but the disclosure is not limited thereto.

G2: the maximum distance between the end of the second metal layer 16 close to the outer edge S12P and the outer edge S12P of the protrusion structure 12 in the direction DT2. In some embodiments, G2 may range from 5 μm and 60 μm (5 μm≤G2≤60 μm), or from 10 μm to 55 μm (10 μm≤G2≤55 μm), but the disclosure is not limited thereto.

G3: the maximum distance between the end of the third metal layer 17 close to the outer edge S12P and the outer edge S12P of the protrusion structure 12 in the direction DT2. In some embodiments, G3 may range from 5 μm to 60 μm (5 μm≤G3≤60 μm), or from 10 μm to 55 μm (10 μm≤G3≤55 μm), but the disclosure is not limited thereto.

T120-12: the minimum thickness of the first organic insulating layer 120 close to the center (e.g., W1/2) of the protrusion structure 12 in the normal direction DT1. In some embodiments, T120-12 may range from 0.5 μm to 2.5 μm (0.5 μm≤T120-12≤2.5 μm), or from 1 μm to 1.7 μm (1 μm≤T120-12≤1.7 μm), but the disclosure is not limited thereto.

T122-12: the minimum thickness of the second organic insulating layer 122 close to the center of the protrusion structure 12 in the normal direction DT1. In some embodiments, T122-12 may range from 0.5 μm to 3.5 μm (0.5 μm≤T122-12≤3.5 μm), or from 1 μm to 2.6 μm (1 μm≤T122-12≤2.6 μm), but the disclosure is not limited thereto.

T124-12: the minimum thickness of the third organic insulating layer 124 close to the center of the protrusion structure 12 in the normal direction DT1. In some embodiments, T124-12 may range from 0.5 μm to 2 μm (0.5 μm≤T124-12≤2 μm), or from 1 μm to 1.5 μm (1 μm≤T124-12≤1.5 μm), but the disclosure is not limited thereto.

T12: the minimum thickness of the protrusion structure 12 close to the center of the protrusion structure 12 in the normal direction DT1. In some embodiments, T12 may range from 3 μm to 7 μm (3 μm≤T12≤7 μm), or from 4 μm to 6 μm (4 μm≤T12≤6 μm), but the disclosure is not limited thereto.

θ1: the included angle (referred to as the first included angle) between the second inorganic insulating layer 15 and the first inorganic insulating layer 14 close to the outer edge S12P in the protrusion structure 12. In some embodiments, θ1 may range from 10 degrees to 50 degrees (10 degrees≤θ1≤50 degrees), or from 15 degrees to 40 degrees (15 degrees≤θ1≤40 degrees), but the disclosure is not limited thereto.

θ2: the included angle (referred to as the second included angle) between the second inorganic insulating layer 15 and the first metal layer 11 close to the inner edge S12N in the protrusion structure 12. In some embodiments, θ2 may range from 15 degrees to 55 degrees (15 degrees≤θ2≤55 degrees), or from 20 degrees to 45 degrees (20 degrees≤θ2≤45 degrees), but the disclosure is not limited thereto.

θ4: the included angle (referred to as the fourth included angle) between the second metal layer 16 and the third metal layer 17 close to the inner edge S12N in the protrusion structure 12. In some embodiments, θ4 may range from 20 degrees to 40 degrees (20 degrees≤θ4≤40 degrees), or from 25 degrees to 35 degrees (25 degrees≤θ4≤35 degrees), but the disclosure is not limited thereto.

θ5: the included angle (referred to as the fifth included angle) between the third metal layer 17 and the first metal layer 11 close to the inner edge S12N in the protrusion structure 12. In some embodiments, θ5 may range from 25 degrees to 45 degrees (25 degrees≤θ5≤45 degrees), or from 30 degrees to 40 degrees (30 degrees≤θ5≤40 degrees), but the disclosure is not limited thereto.

G: the minimum distance between the protrusion structure 12 and the inner protrusion structure 18 in the direction DT2. In some embodiments, G may range from 25 μm to 80 μm (25 μm≤G≤80 μm), or from 30 μm to 75 μm (30 μm≤G≤75 μm), but the disclosure is not limited thereto.

W2: the maximum distance of the orthographic projection of the inner protrusion structure 18 on the substrate 10 in the direction DT2. In some embodiments, W2 may range from 30 μm to 50 μm (30 μm≤W2≤50 μm), or from 35 μm to 45 μm (35 μm≤W2≤45 μm), but the disclosure is not limited thereto.

W11: the maximum distance of the orthographic projection of the first metal layer 11 that is not connected to the third metal layer 17 in the inner protrusion structure 18 on the substrate 10 in the direction DT2. In some embodiments, W11 may range from 25 μm to 40 μm (25 μm≤W11≤40 μm), or from 30 μm to 35 μm (30 μm≤W11≤35 μm), but the disclosure is not limited thereto.

W11N: the minimum distance between the first metal layer 11 that is not connected to the third metal layer 17 in the inner protrusion structure 18 and the inner edge S18N of the inner protrusion structure 18 in the direction DT2. In some embodiments, W11N may range from 3 μm to 6 μm (3 μm≤W11N≤6 μm), or from 4 μm to 5 μm (4 μm≤W11N≤5 μm), but the disclosure is not limited thereto.

W11P: the minimum distance between the first metal layer 11 that is not connected to the third metal layer 17 in the inner protrusion structure 18 and the outer edge S18P of the inner protrusion structure 18 in the direction DT2. In some embodiments, W11P may range from 3 μm to 6 μm (3 μm≤W11P≤6 μm), or from 3.5 μm to 4.5 μm (3.5 μm≤W11P≤4.5 μm), but the disclosure is not limited thereto.

T122-18: the minimum thickness of the second organic insulating layer 122 close to the center of the inner protrusion structure 18 in the normal direction DT1. In some embodiments, T122-18 may range from 1 μm to 4 μm (1 μm≤T122-18≤4 μm), or from 2 μm to 3 μm (2 μm≤T122-18≤3 μm), but the disclosure is not limited thereto.

T124-18: the minimum thickness of the third organic insulating layer 124 close to the center of the inner protrusion structure 18 in the normal direction DT1. In some embodiments, T124-18 may range from 0.5 μm to 2.5 μm (0.5 μm≤T124-18≤2.5 μm), or from 1 μm to 2 μm (1 μm≤T124-18≤2 μm), but the disclosure is not limited thereto.

T18: the minimum thickness of the inner protrusion structure 18 close to the center of the inner protrusion structure 18 in the normal direction DT1. In some embodiments, T18 may range from 1.5 μm to 4.5 μm (1.5 μm≤T18≤4.5 μm), or from 2 μm to 4 μm (2 μm≤T18≤4 μm), but the disclosure is not limited thereto.

θ6N: the included angle between the second inorganic insulating layer 15 and the first metal layer 11 close to the inner edge S18N in the inner protrusion structure 18. In some embodiments, θ6N may range from 20 degrees to 55 degrees (20 degrees≤θ6N≤55 degrees), or from 30 degrees to 50 degrees (30 degrees≤θ6N≤50 degrees), but the disclosure is not limited thereto.

θ6P: the included angle between the second inorganic insulating layer 15 and the first metal layer 11 close to the outer edge S18P in the inner protrusion structure 18. In some embodiments, θ6P may range from 15 degrees to 55 degrees (15 degrees≤θ6P≤55 degrees), or from 20 degrees to 50 degrees (20 degrees≤θ6P≤50 degrees), but the disclosure is not limited thereto.

θ7N: the included angle between the first metal layer 11 and the third metal layer 17 close to the inner edge S18N in the inner protrusion structure 18. In some embodiments, θ7N may range from 20 degrees to 50 degrees (20 degrees≤θ7N≤50 degrees), or from 25 degrees to 40 degrees (25 degrees≤θ7N≤40 degrees), but the disclosure is not limited thereto.

θ7P: the included angle between the first metal layer 11 and the third metal layer 17 close to the outer edge S18P in the inner protrusion structure 18. In some embodiments, θ7P may range from 15 degrees to 45 degrees (15 degrees≤θ7P≤45 degrees), or from 20 degrees to 40 degrees (20 degrees≤θ7P≤40 degrees), but the disclosure is not limited thereto.

TABLE 1

| Protrusion structure 12←--------------→ Inner protrusion structure 18 | | | | | |
|---|---|---|---|---|---|
| W1 | 52.11 μm | G | 39.4 μm | W2 | 40.65 μm |
| D1 | 42.28 μm | | | W11 | 32.21 μm |
| D1' | 37.07 μm | | | W11N | 4.57 μm |
| D2 | 33.60 μm | | | W11P | 3.92 μm |
| D3 | 31.22 μm | | | T122-18 | 2.23 μm |
| G1 | 9.83 μm | | | T124-18 | 1.64 μm |
| G2 | 11.71 μm | | | T18 | 3.92 μm |
| G3 | 14.19 μm | | | θ6N | 41.35° |
| T120-12 | 1.44 μm | | | θ6P | 45° |
| T122-12 | 1.49 μm | | | θ7N | 31.33° |
| T124-12 | 1.04 μm | | | θ7P | 27.47° |
| T12 | 5.54 μm | | | | |
| θ1 | 39.64° | | | | |
| θ2 | 45° | | | | |
| θ4 | 33.18° | | | | |
| θ5 | 34.70° | | | | |

Figure 3:
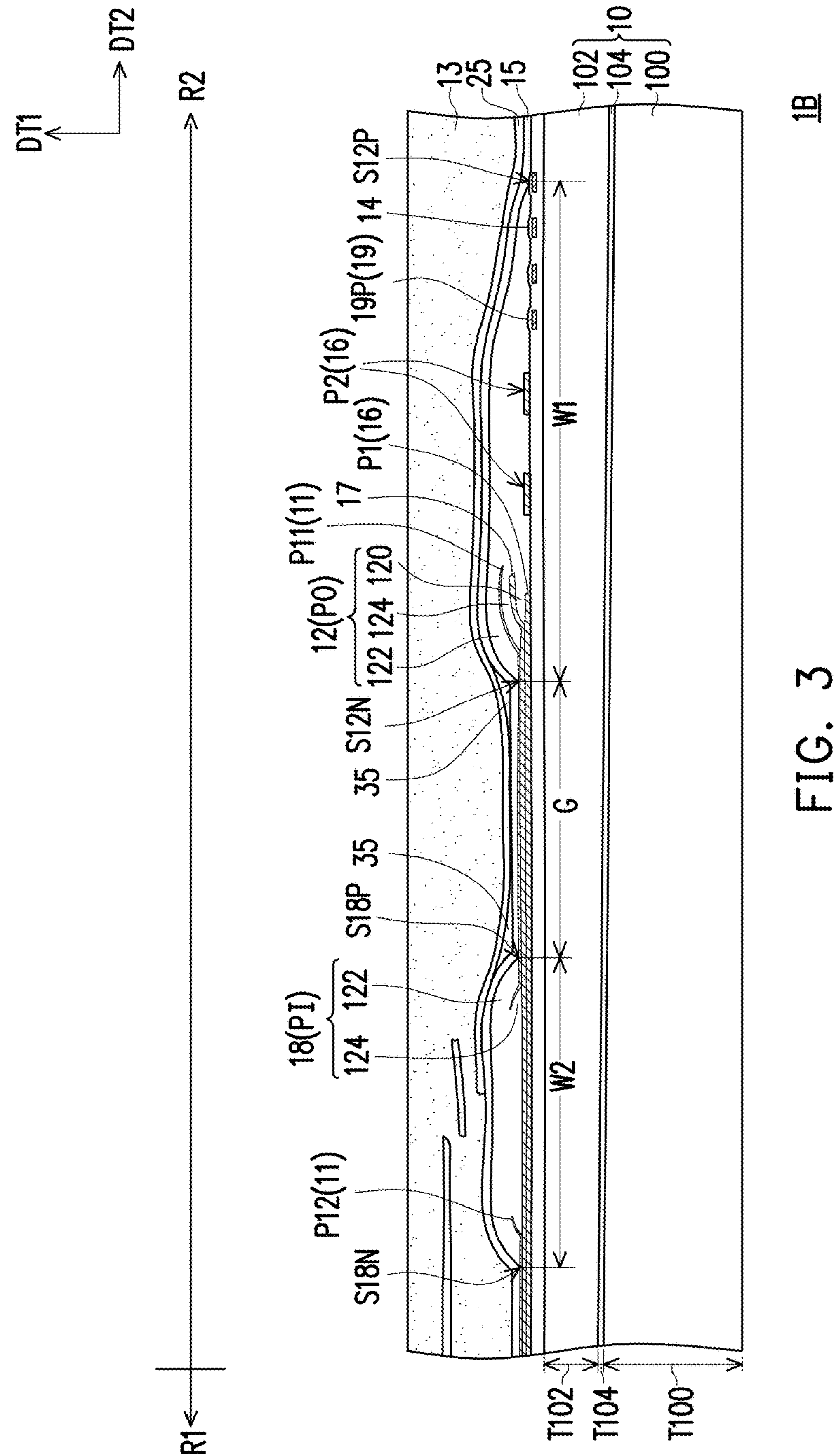
Figure 3A:
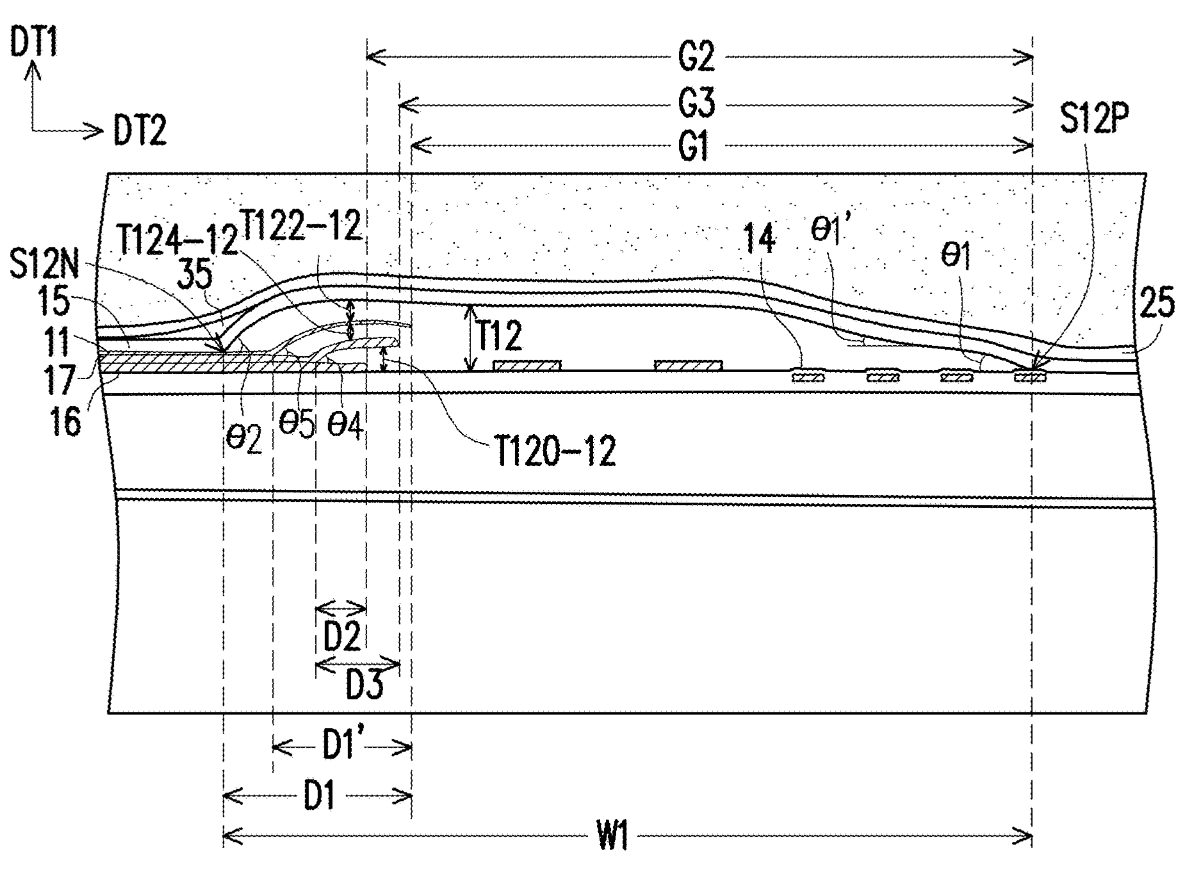
Figure 3B:
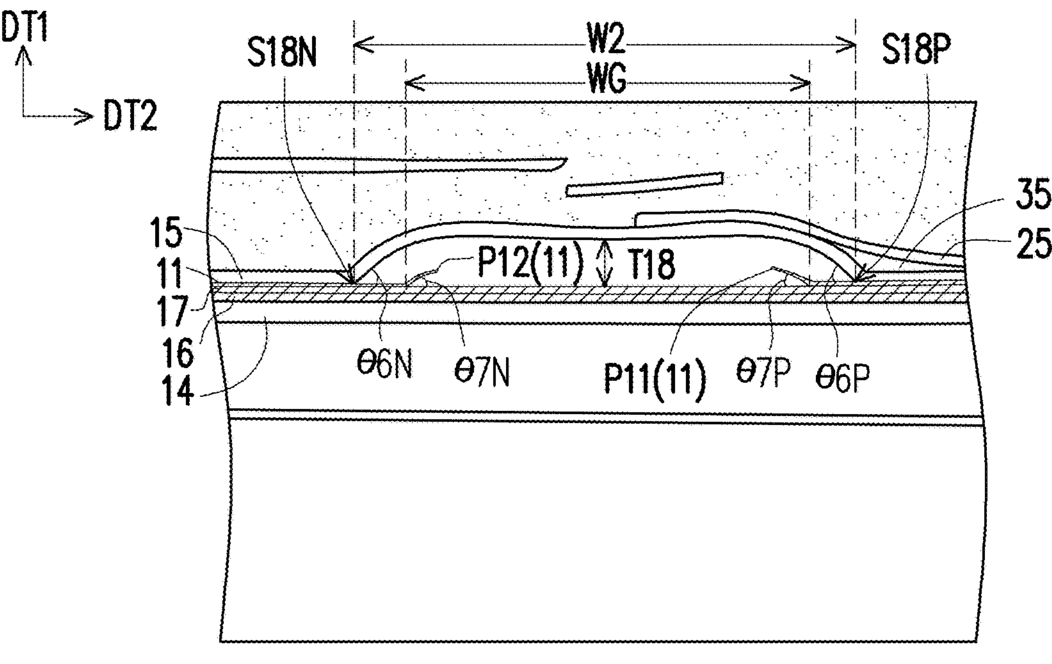

Referring to FIG. 3, FIG. 3A, and FIG. 3B, the main differences between an electronic device 1B and the electronic device 1A in FIG. 2, FIG. 2A, and FIG. 2B are as follows.

In the electronic device 1B, the thickness T100 of the first substrate 100, the thickness T102 of the second substrate 102, and the thickness T104 of the intermediate layer 104 are, for example, 9.6 μm, 5.2 μm, and 0.6 μm in the order, but the disclosure is not limited thereto.

The first metal layer 11 is a single metal layer, and the thickness T1 of the first metal layer 11 is 94 nm, but the disclosure is not limited thereto. In some embodiments, the thickness T1 of the first metal layer 11 is the maximum thickness in the normal direction DT1, and a relatively flat portion may be selected for measurement. In the embodiment, the first metal layer 11 includes a first portion P11 and a second portion P12. The opposite ends of the first portion P11 respectively are located in the protrusion structure 12 and the inner protrusion structure 18. The second portion P12 extends into the inner protrusion structure 18 and ends in the inner protrusion structure 18, and the second portion P12 and the first portion P11 are separated in the inner protrusion structure 18. In other words, the second portion P12 and the first portion P11 are disconnected (separated) in the inner protrusion structure 18 rather than connected. Therefore, when the first metal layer 11 in the protrusion structure 12 is corroded, the occurrence of the corrosion spreading through the first metal layer 11 to the display region R1 (see FIG. 1) is reduced.

The second metal layer 16 includes three conductive layers, and the thicknesses of the three conductive layers along the normal direction DT1 are, for example, 85 nm, 614 nm, and 37 nm in the order, but the disclosure is not limited thereto. In some embodiments, the thicknesses of the three conductive layers of the second metal layer 16 respectively are the maximum thickness in the normal direction DT1, and a relatively flat portion may be selected for measurement. In the embodiment, the second metal layer 16 includes a first portion P1 and a plurality of second portions P2 extending into the protrusion structure 12 and ending in the protrusion structure 12. The plurality of second portions P2 are separated from the first portion P1 and are arranged from the first portion P1 toward the edge of the substrate 10. Among the plurality of second portions P2, the second portion P2 closest to the edge of the substrate 10 overlaps the protrusion structure 12 in the normal direction DT1 of the substrate 10. In other words, the second portion P2 closest to the edge of the substrate 10 does not extend to the outside of the protrusion structure 12, which reduces the corrosion of the second metal layer 16.

The third metal layer 17 includes three conductive layers, and the thicknesses of the three conductive layers along the normal direction DT1 are, for example, 104 nm, 635 nm, and 40 nm in the order, but the disclosure is not limited thereto. In some embodiments, the thicknesses of the three conductive layers of the third metal layer 17 respectively are the maximum thickness in the normal direction DT1, and a relatively flat portion may be selected for measurement.

The electronic device 1B further includes a fourth metal layer 19. The fourth metal layer 19 is separated from the second metal layer 16 through the first inorganic insulating layer 14. The fourth metal layer 19 is adapted to transmit signals. Taking an OLED display device as an example, the fourth metal layer 19 may be a patterned metal layer and may include a plurality of patterns 19P. For example, the fourth metal layer 19 may include a plurality of scan lines (not shown) in the display region R1 (see FIG. 1), a plurality of gates of a plurality of active elements (not shown), and the plurality of the patterns 19P located in the peripheral region R2, but the disclosure is not limited thereto. In some embodiments, the protrusion structure 12 may overlap at least part of the plurality of the patterns 19P in the normal direction DT1, but the disclosure is not limited thereto. The fourth metal layer 19 may be a single metal layer or a stack of metal layers. For the description of the stack of metal layers, refer to the foregoing, and it is not iterated.

The related parameters of each film layer in FIG. 3, FIG. 3A, and FIG. 3B are listed in Table 2. However, note that the values in Table 2 only represent an embodiment under the framework of FIG. 3, but simple equivalent changes and modifications made in accordance with this specification or claims still fall within the scope of the disclosure.

In Table 2, WG is the maximum distance from the separation part between the first portion P11 of the first metal layer 11 and the third metal layer 17 to the separation part between the second portion P12 of the first metal layer 11 and the third metal layer 17 in the direction DT2. In the embodiment, the protrusion structure 12 has a step-like descending edge (as shown in FIG. 3A) close to the outer edge S12P. In other words, the included angle between the edge extension line of the protrusion structure 12 and the substrate 10 appears substantially different. θ1' is the included angle between the second inorganic insulating layer 15 at the step-like descending edge of the protrusion structure 12 and the substrate 10, or θ1' may be regarded as the included angle between the extension line of the second inorganic insulating layer 15 at the step-like descending edge of the protrusion structure 12 and the substrate 10.

For the description of other related parameters, refer to the foregoing, and it is not iterated.

TABLE 2

| Protrusion structure 12 ←--------------→ Inner protrusion structure 18 | | | | | |
|---|---|---|---|---|---|
| W1 | 65.21 μm | G | 34 μm | W2 | 40.5 μm |
| D1 | 15.49 μm | | | WG | 32.46 μm |
| D1' | 11.47 μm | | | T18 | 3.87 μm |
| D2 | 4.76 μm | | | θ6N | 44.12° |
| D3 | 6.79 μm | | | θ6P | 42.95° |
| G1 | 49.85 μm | | | θ7N | 35.84° |
| G2 | 53.14 μm | | | θ7P | 37.87° |
| G3 | 51.10 μm | | | | |
| T120-12 | 1.45 μm | | | | |
| T122-12 | 1.72 μm | | | | |
| T124-12 | 1.19 μm | | | | |
| T12 | 5.42 μm | | | | |
| θ1 | 18° | | | | |
| θ1' | 15.42° | | | | |
| θ2 | 45° | | | | |
| θ4 | 26.57° | | | | |
| θ5 | 34.99° | | | | |

Figure 4:
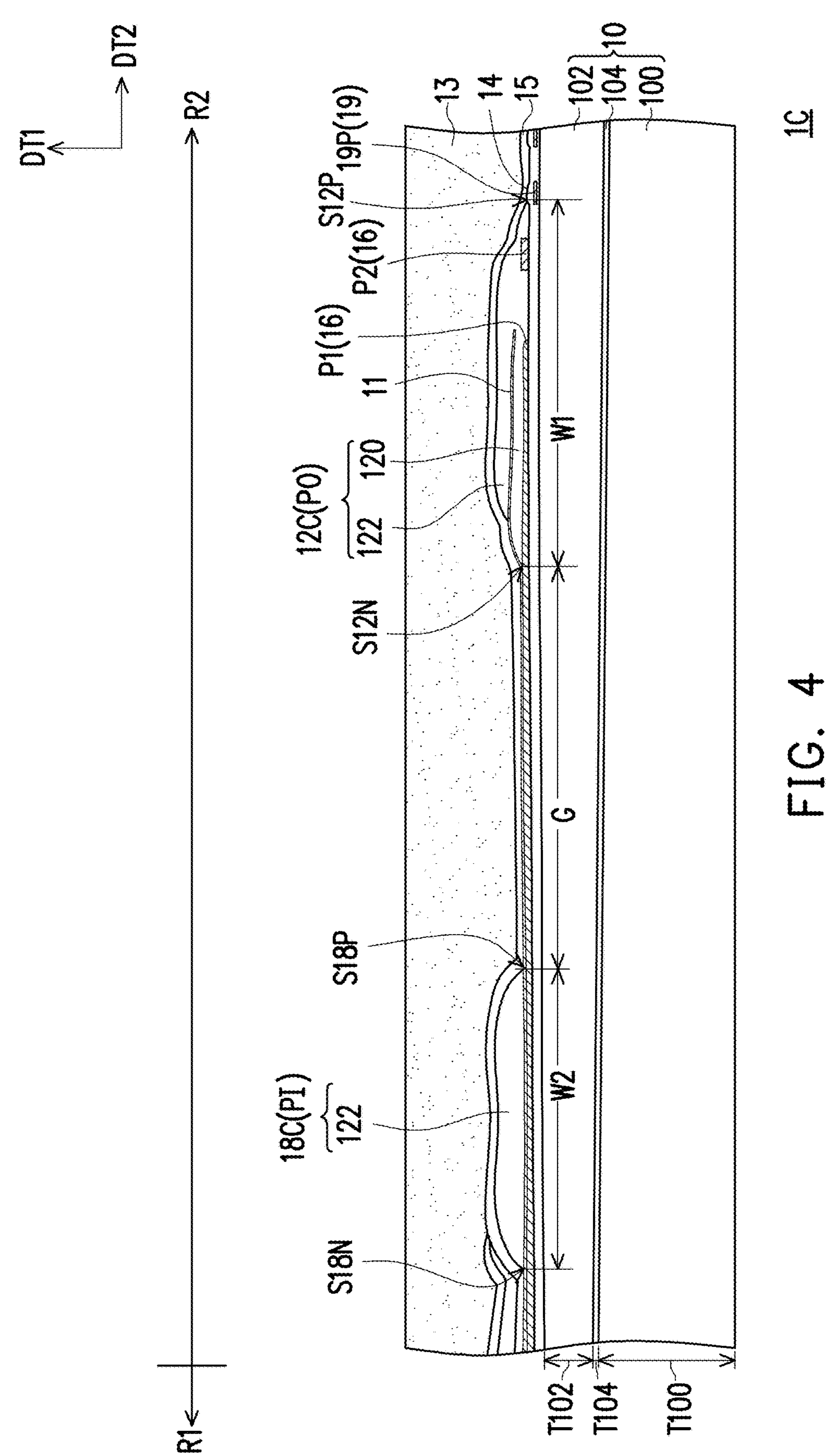
Figure 4A:
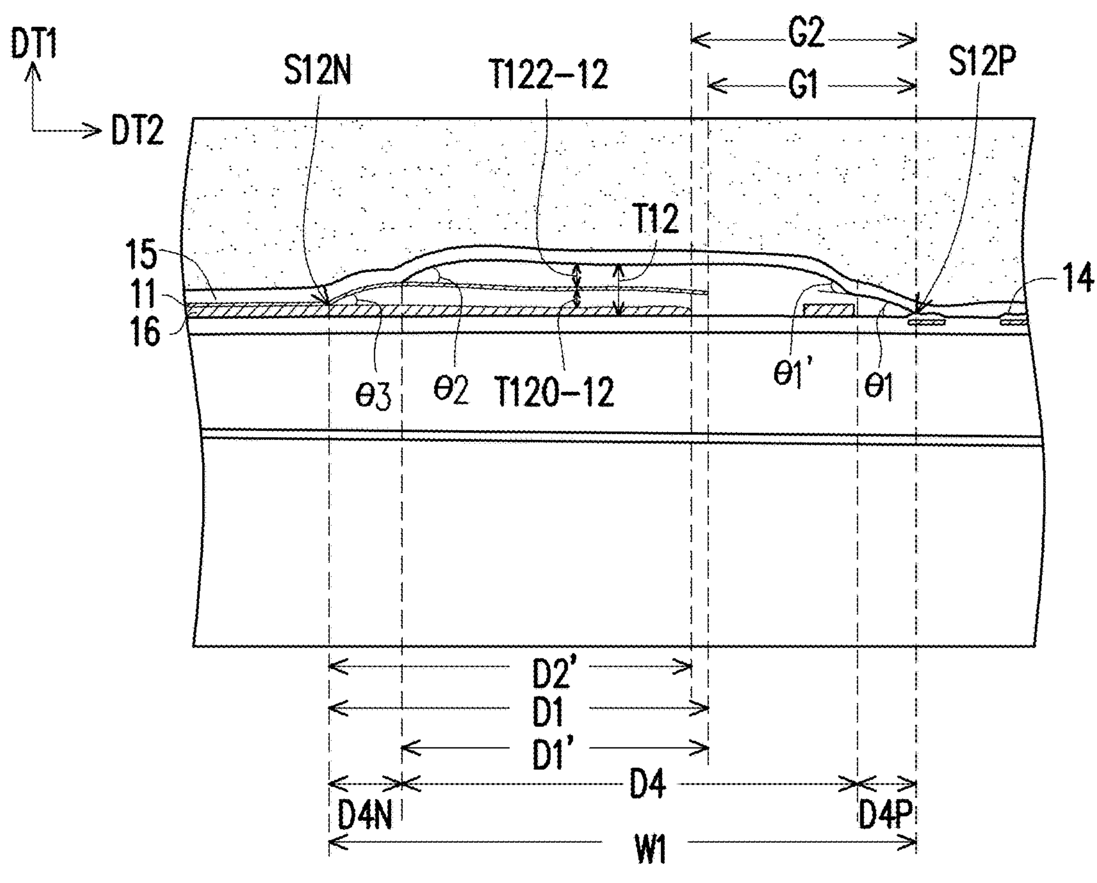
Figure 4B:
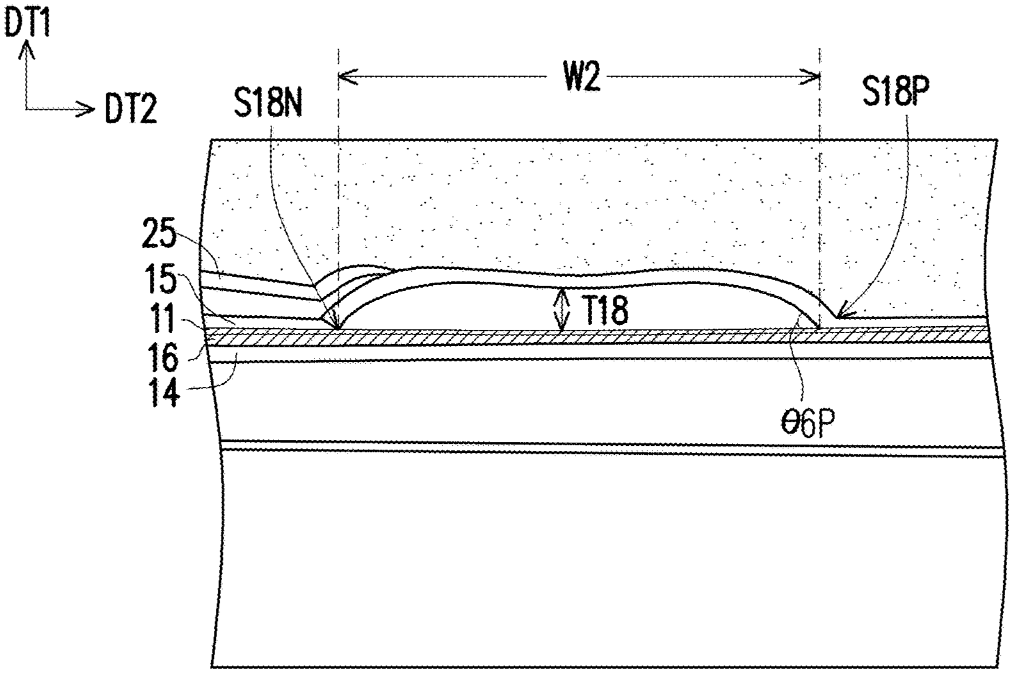

Referring to FIG. 4, FIG. 4A, and FIG. 4B, the main differences between the electronic device 1C and the electronic device 1B in FIG. 3, FIG. 3A, and FIG. 3B are as follows.

In the electronic device 1C, the thickness T100 of the first substrate 100, the thickness T102 of the second substrate 102, and the thickness T104 of the intermediate layer 104 are, for example, 9.7 μm, 5.2 μm, and 0.7 μm in the order, but the disclosure is not limited thereto.

The first metal layer 11 is a single metal layer, and the thickness T1 of the first metal layer 11 is 100 nm, but the disclosure is not limited thereto. In some embodiments, the thickness T1 of the first metal layer 11 is the maximum thickness in the normal direction DT1, and a relatively flat portion may be selected for measurement. The second metal layer 16 includes three conductive layers, and the thicknesses of the three conductive layers along the normal direction DT1 are, for example, 94.8 nm, 653.1 nm, and 71.1 nm in the order, but the disclosure is not limited thereto. In some embodiments, the thicknesses of the three conductive layers of the second metal layer 16 respectively are the maximum thickness in the normal direction DT1, and a relatively flat portion may be selected for measurement. In the embodiment, the number of the second portion P2 of the second metal layer 16 is one, but the disclosure is not limited thereto. In addition, the electronic device 1C does not include the third metal layer 17 in FIG. 3, FIG. 3A, and FIG. 3B. In addition, the protrusion structure 12C includes the first organic insulating layer 120 and the second organic insulating layer 122 but does not include the third organic insulating layer 124 in FIG. 3, FIG. 3A, and FIG. 3B, and the first metal layer 11 extending into the protrusion structure 12C is located between the second organic insulating layer 122 and the first organic insulating layer 120. Furthermore, the inner protrusion structure 18C includes the second organic insulating layer 122 but does not include the third organic insulating layer 124 in FIG. 3, FIG. 3A, and FIG. 3B, and the entire first metal layer 11 extending into the inner protrusion structure 18C is in contact with the second metal layer 16. Similar to FIG. 3, the electronic device 1C may include the fourth metal layer 19 having the plurality of the patterns 19P. In the embodiment, the protrusion structure 12C may overlap part of the patterns 19P in the normal direction DT1 and does not overlap another part of the patterns 19P in the normal direction DT1, but the disclosure is not limited thereto.

The related parameters of each film layer in FIG. 4, FIG. 4A, and FIG. 4B are listed in Table 3. However, note that the values in Table 3 only represent an embodiment under the framework of FIG. 4, but simple equivalent changes and modifications made in accordance with this specification or claims still fall within the scope of the disclosure.

In Table 3, D2' is the maximum distance of the orthographic projection of the second metal layer 16 that is not in contact with the first metal layer 11 in the protrusion structure 12C on the substrate 10 in the direction DT2. In the embodiment, the protrusion structure 12 close to the outer edge S12P and close to the inner edge S12N respectively have a step-like descending edge (as shown in FIG. 4A). In other words, the top and the bottom of the protrusion structure 12 are roughly distinguished according to the step-like descending edge. The top roughly corresponds to the second organic insulating layer 122, and the bottom roughly corresponds to the first organic insulating layer 120, but the disclosure is not limited thereto. D4N is the minimum distance between the inner edge of the top of the protrusion structure 12C and the inner edge S12N of the bottom of the protrusion structure 12C in the direction DT2. D4P is the minimum distance between the outer edge of the top of the protrusion structure 12C and the outer edge S12P of the bottom of the protrusion structure 12C in the direction DT2. θ3 is the included angle (referred to as the third included angle) between the second inorganic insulating layer 15 and the second metal layer 16 in the protrusion structure 12. For the description of other related parameters, refer to the foregoing, and it is not iterated.

TABLE 3

| Protrusion structure 12C ←--------------→ Inner protrusion structure 18C | | | | | |
|---|---|---|---|---|---|
| W1 | 51.22 μm | G | 49.8 μm | W2 | 39.35 μm |
| D1 | 33.06 μm | | | T18 | 2.79 μm |
| D1' | 26.70 μm | | | θ6P | 37.69° |
| D2' | 31.91 μm | | | | |
| D4 | 39.21 μm | | | | |
| D4N | 6.05 μm | | | | |
| D4P | 5.56 μm | | | | |
| G1 | 18.16 μm | | | | |
| G2 | 19.16 μm | | | | |
| T120-12 | 1.54 μm | | | | |
| T122-12 | 2.04 μm | | | | |
| T12 | 4.48 μm | | | | |
| θ1 | 32.47° | | | | |
| θ1' | 39.09° | | | | |
| θ2 | 30.38° | | | | |
| θ3 | 25.77° | | | | |

Figure 5:
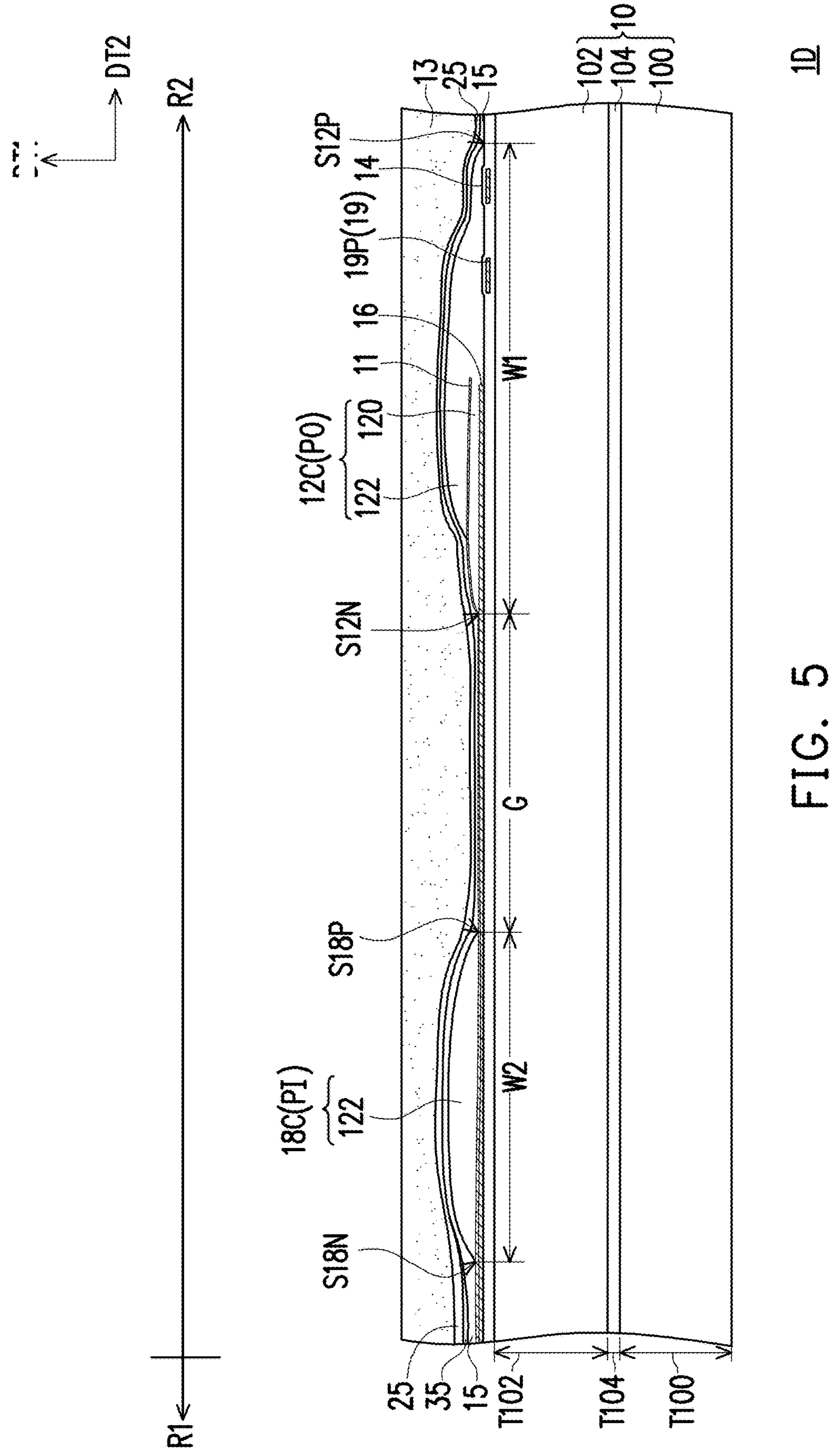
Figure 5A:
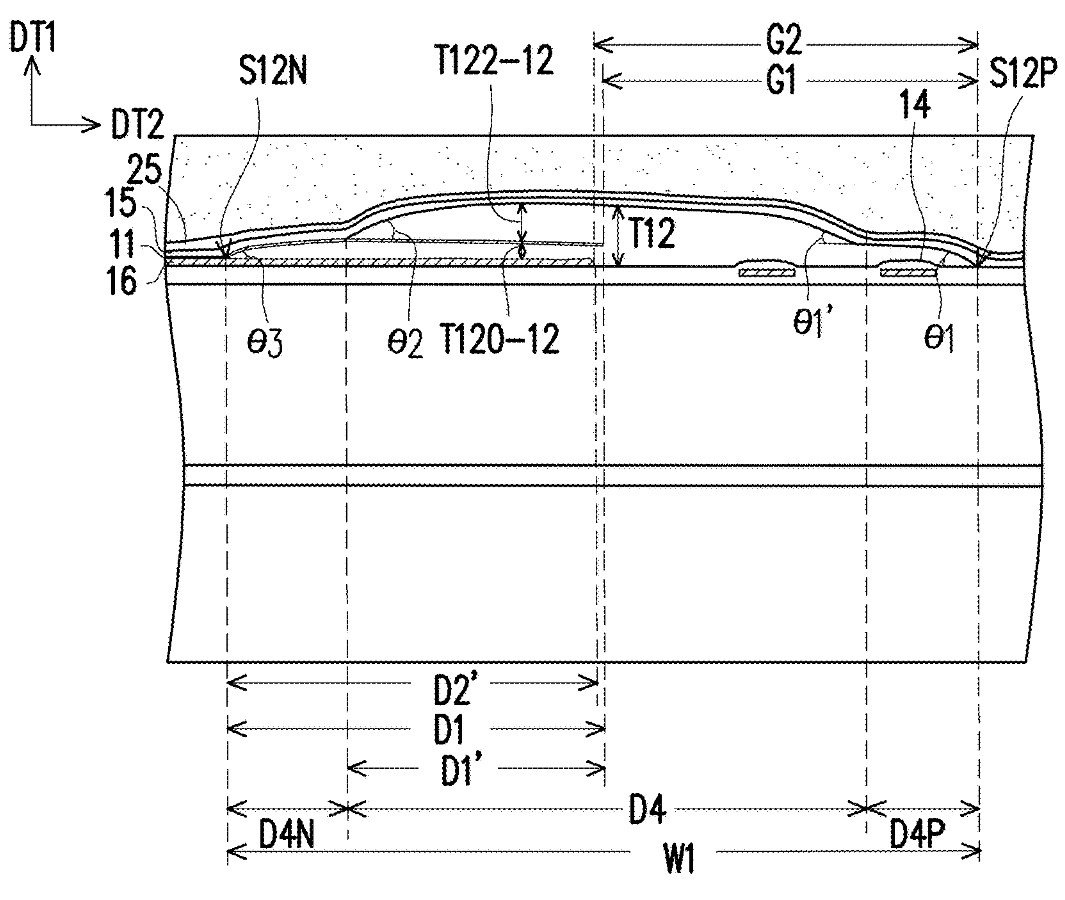
Figure 5B:
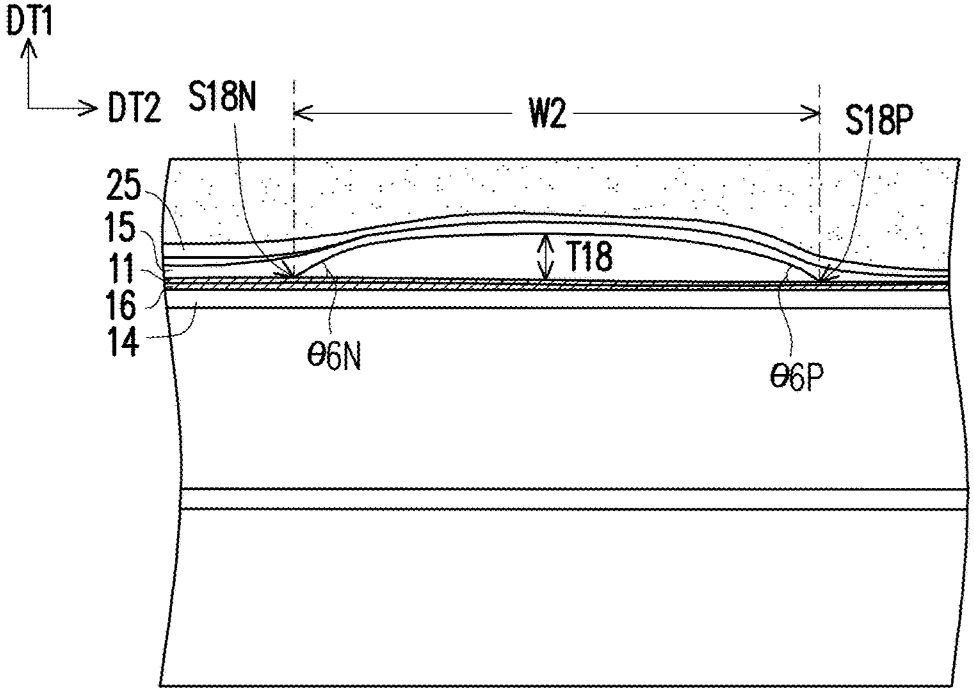

Referring to FIG. 5, FIG. 5A, and FIG. 5B, the main differences between an electronic device 1D and the electronic device 1C in FIG. 4, FIG. 4A and FIG. 4B are as follows.

In the electronic device 1D, the thickness T100 of the first substrate 100, the thickness T102 of the second substrate 102, and the thickness T104 of the intermediate layer 104 are, for example, 9.9 μm, 10 μm, and 1.9 μm in the order, but the disclosure is not limited thereto.

The first metal layer 11 is a single metal layer, and the thickness T1 of the first metal layer 11 is 72.7 nm, but the disclosure is not limited thereto. In some embodiments, the thickness T1 of the first metal layer 11 is the maximum thickness in the normal direction DT1, and a relatively flat portion may be selected for measurement. The second metal layer 16 includes three conductive layers, and the thicknesses of the three conductive layers are, for example, 71.9 nm, 380 nm, and 37.7 nm in the order, but the disclosure is not limited thereto. In some embodiments, the thicknesses of the three conductive layers of the second metal layer 16 respectively are the maximum thickness in the normal direction DT1, and a relatively flat portion may be selected for measurement. In the embodiment, the second metal layer 16 does not include the second portion P2 in FIG. 4, FIG. 4A, and FIG. 4B. Similar to FIG. 3, the electronic device 1D may include the fourth metal layer 19 having the plurality of the patterns 19P. In the embodiment, the protrusion structure 12C overlaps at least part of the patterns 19P in the normal direction DT1, but the disclosure is not limited thereto.

The related parameters of each film layer in FIG. 5, FIG. 5A, and FIG. 5B are listed in Table 4. However, note that the values in Table 4 only represent an embodiment under the framework of FIG. 5, but simple equivalent changes and modifications made in accordance with this specification or claims still fall within the scope of the disclosure.

TABLE 4

| Protrusion structure 12C ←--------------→ Inner protrusion structure 18C | | | | | |
|---|---|---|---|---|---|
| W1 | 59.5 μm | G | 43.2 μm | W2 | 40 μm |
| D1 | 30.27 μm | | | T18 | 3.27 μm |
| D1' | 20.25 μm | | | θ6N | 36.16° |
| D2' | 29.83 μm | | | θ6P | 37.18° |
| D4 | 40.2 μm | | | | |
| D4N | 9.83 μm | | | | |
| D4P | 9.48 μm | | | | |
| G1 | 29.28 μm | | | | |
| G2 | 29.78 μm | | | | |
| T120-12 | 1.24 μm | | | | |
| T122-12 | 2.54 μm | | | | |
| T12 | 4.27 μm | | | | |
| θ1 | 24.10° | | | | |
| θ1' | 25.68° | | | | |
| θ2 | 29.05° | | | | |
| θ3 | 18.43° | | | | |

Figure 6:
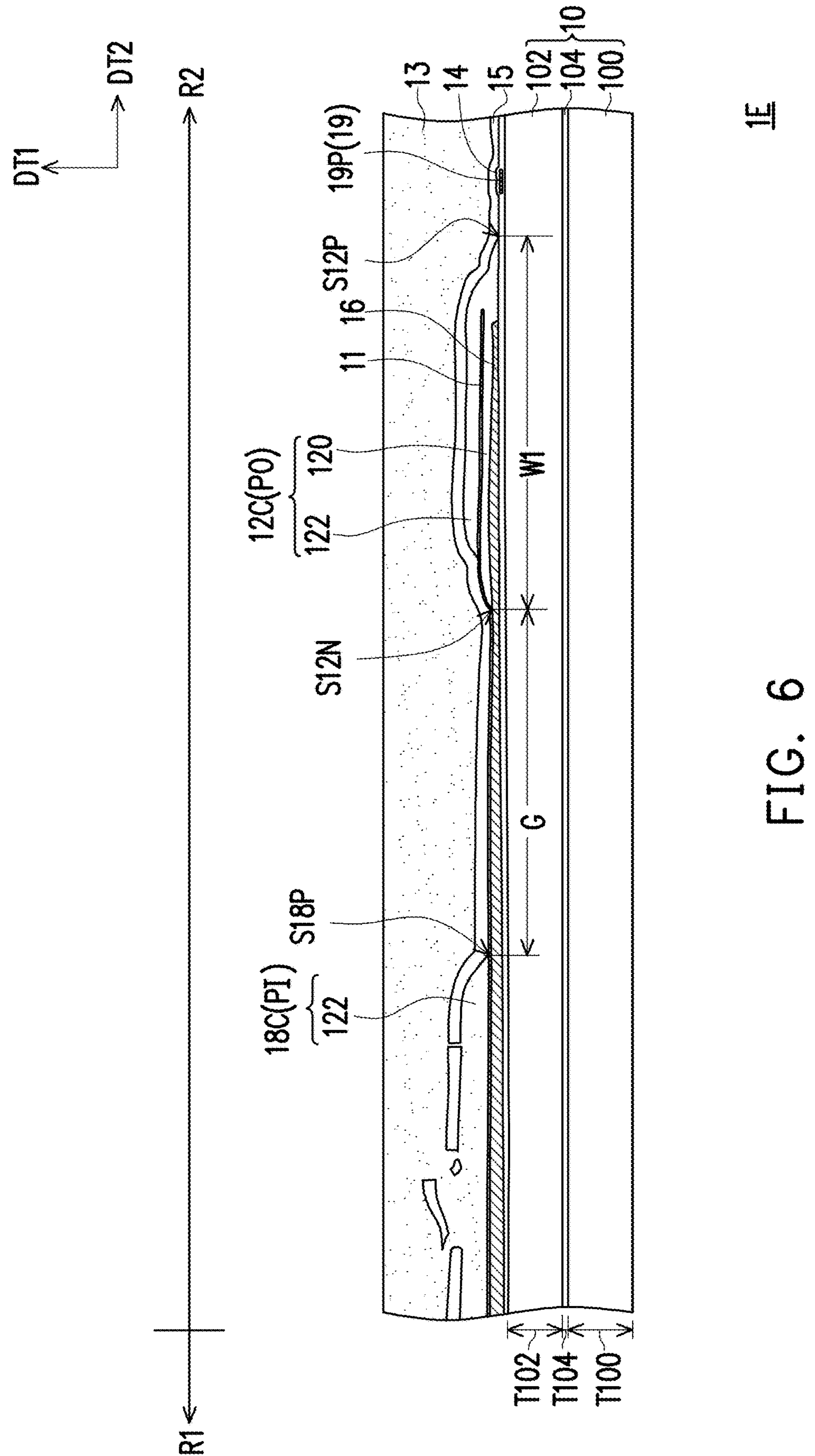
Figure 6A:
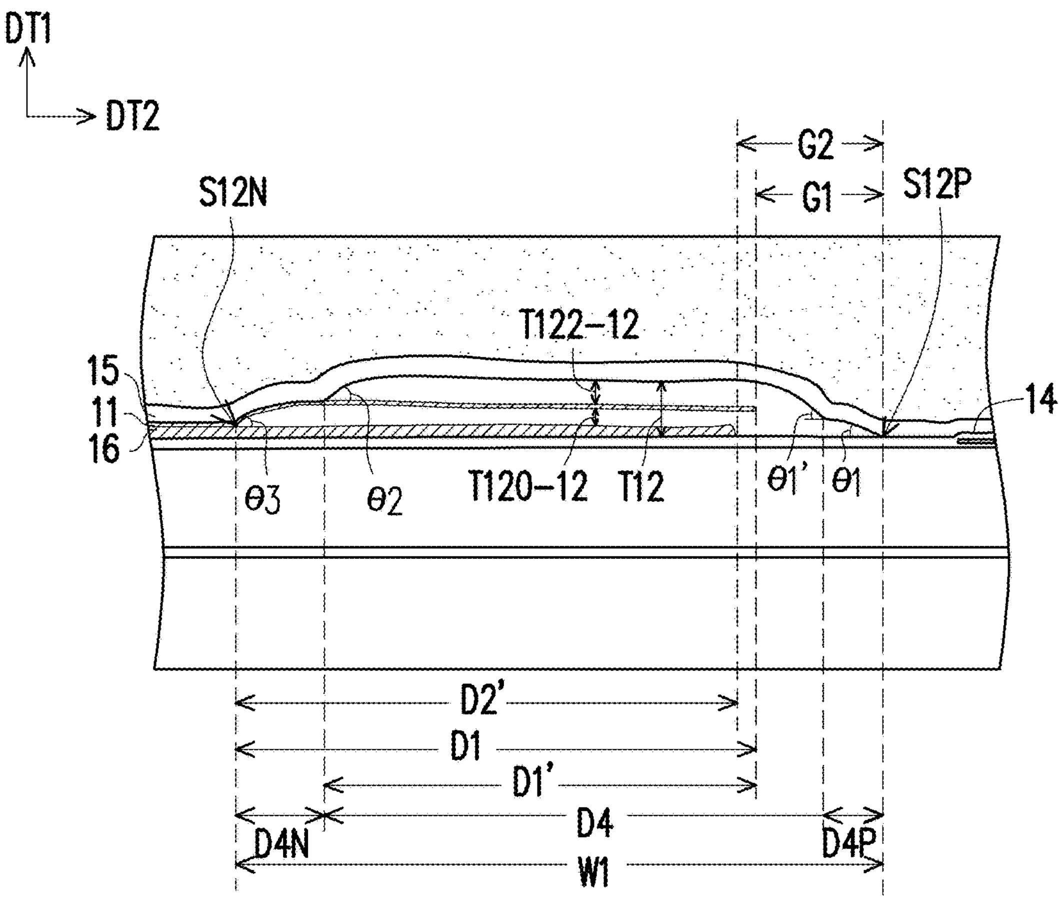
Figure 6B:
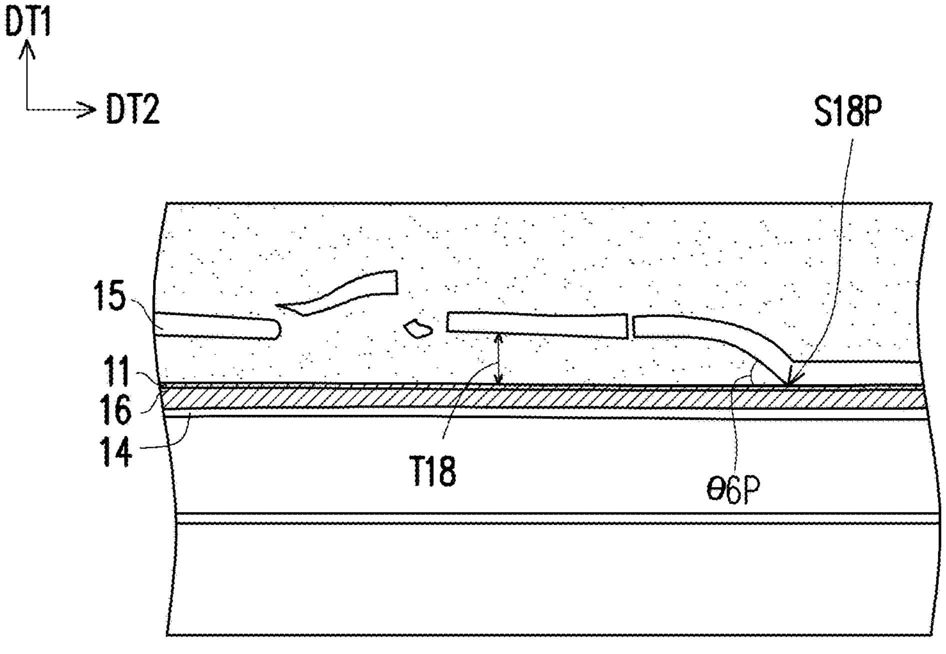

Referring to FIG. 6, FIG. 6A, and FIG. 6B, the main differences between an electronic device 1E and the electronic device 1D in FIG. 5, FIG. 5A, and FIG. 5B are as follows.

In the electronic device 1E, the thickness T100 of the first substrate 100, the thickness T102 of the second substrate 102, and the thickness T104 of the intermediate layer 104 are, for example, 5.5 μm, 5.2 μm, and 0.7 μm in the order, but the disclosure is not limited thereto.

The first metal layer 11 is a single metal layer, and the thickness T1 of the first metal layer 11 is 88 nm, but the disclosure is not limited thereto. In some embodiments, the thickness T1 of the first metal layer 11 is the maximum thickness in the normal direction DT1, and a relatively flat portion may be selected for measurement. The second metal layer 16 includes three conductive layers, and the thicknesses of the three conductive layers along the normal direction DT1 are, for example, 89.5 nm, 589.9 nm, and 34.2 nm in the order, but the disclosure is not limited thereto. In some embodiments, the thicknesses of the three conductive layers of the second metal layer 16 respectively are the maximum thickness in the normal direction DT1, and a relatively flat portion may be selected for measurement. Similar to FIG. 3, the electronic device 1E may include the fourth metal layer 19 having the at least one pattern 19P. In the embodiment, the protrusion structure 12C does not overlap the pattern 19P in the normal direction DT1, but the disclosure is not limited thereto.

The related parameters of each film layer in FIG. 6, FIG. 6A, and FIG. 6B are listed in Table 5. However, note that the values in Table 5 only represent an embodiment under the framework of FIG. 6, but simple equivalent changes and modifications made in accordance with this specification or claims still fall within the scope of the disclosure.

TABLE 5

| Protrusion structure 12C ←--------------→ Inner protrusion structure 18C | | | | | |
|---|---|---|---|---|---|
| W1 | 50.85 μm | G | 55.7 μm | T18 | 3.17 μm |
| D1 | 41.05 μm | | | θ6P | 42.51° |
| D1' | 34.43 μm | | | | |
| D2' | 39.45 μm | | | | |
| D4 | 39.75 μm | | | | |
| D4N | 6.62 μm | | | | |
| D4P | 4.28 μm | | | | |
| G1 | 9.75 μm | | | | |
| G2 | 11.00 μm | | | | |
| T120-12 | 1.39 μm | | | | |
| T122-12 | 2.08 μm | | | | |
| T12 | 4.36 μm | | | | |
| θ1 | 19.98° | | | | |
| θ1' | 43.15° | | | | |
| θ2 | 35.71° | | | | |
| θ3 | 17.97° | | | | |

Figure 7:
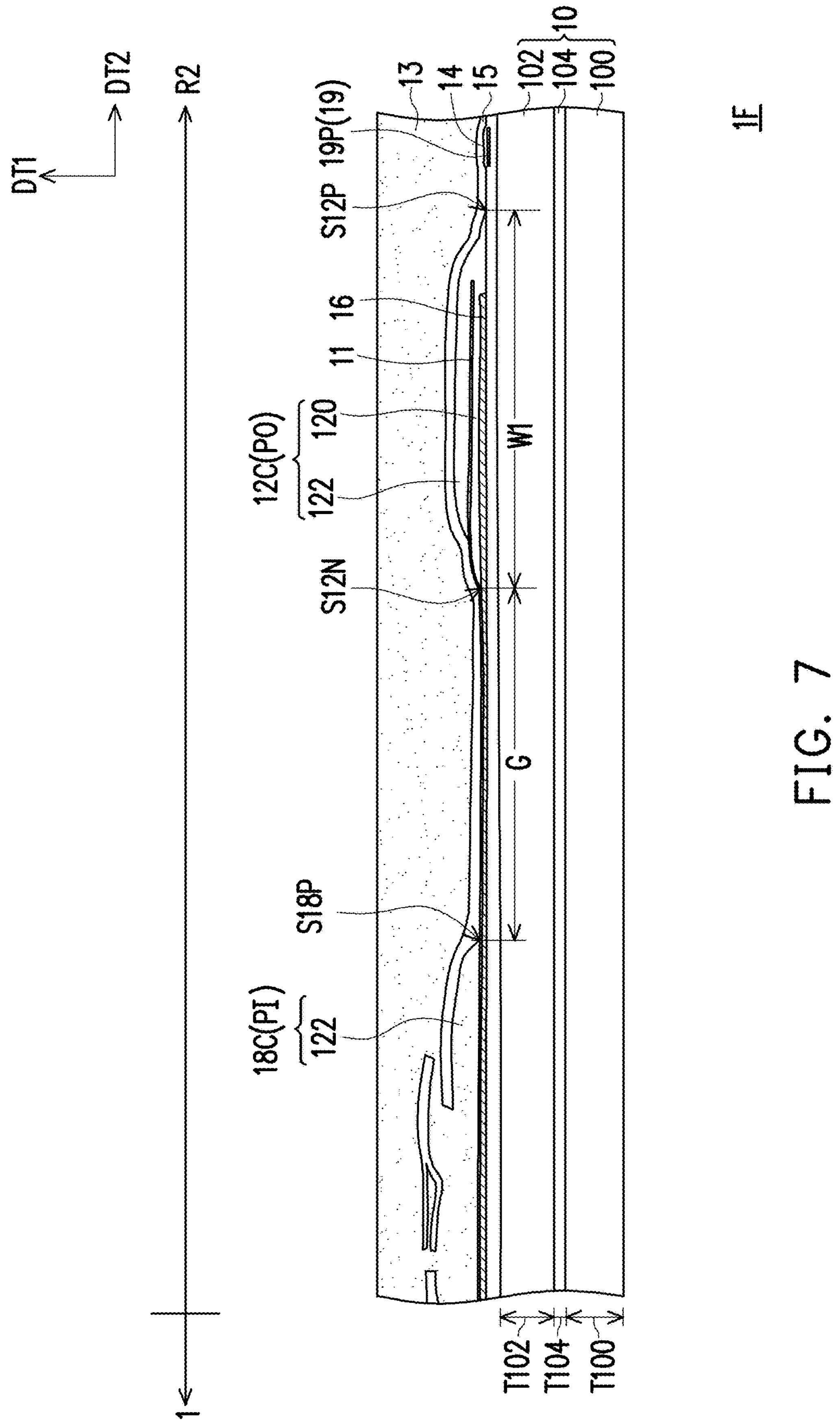
Figure 7A:
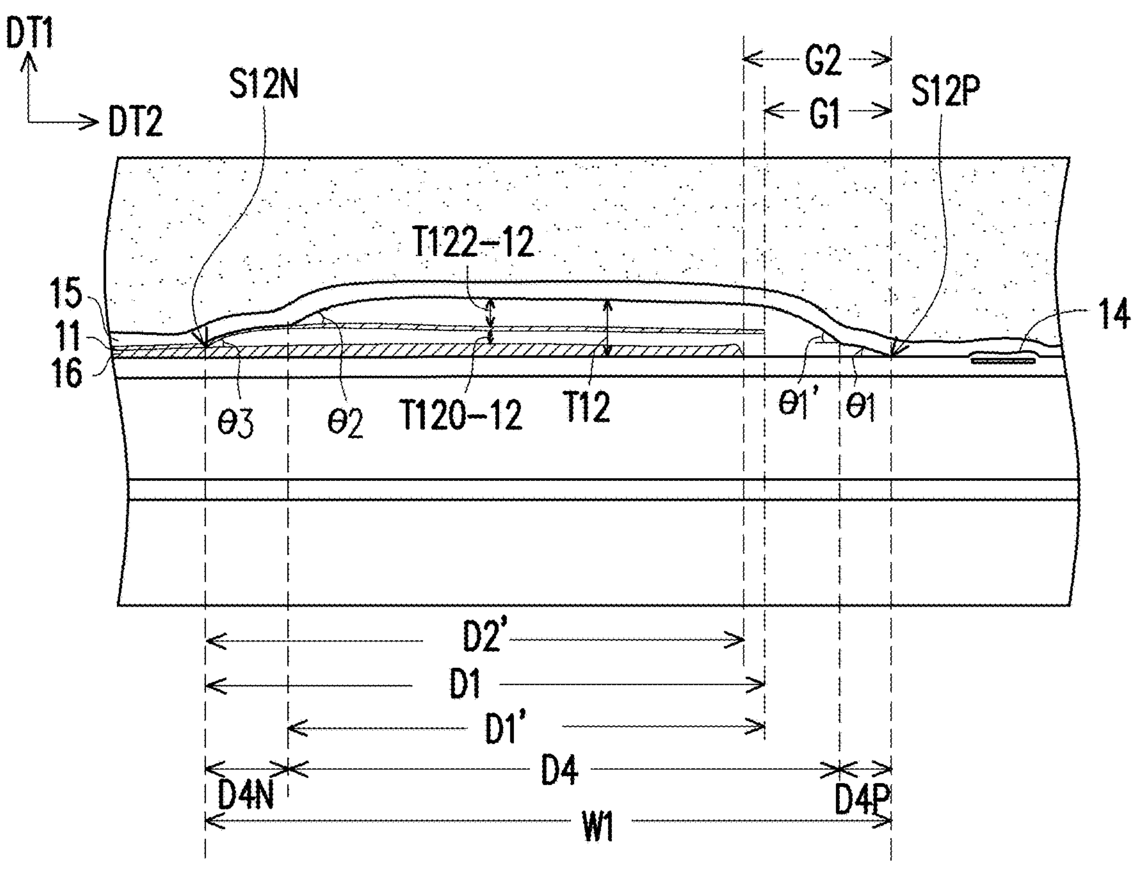
Figure 7B:
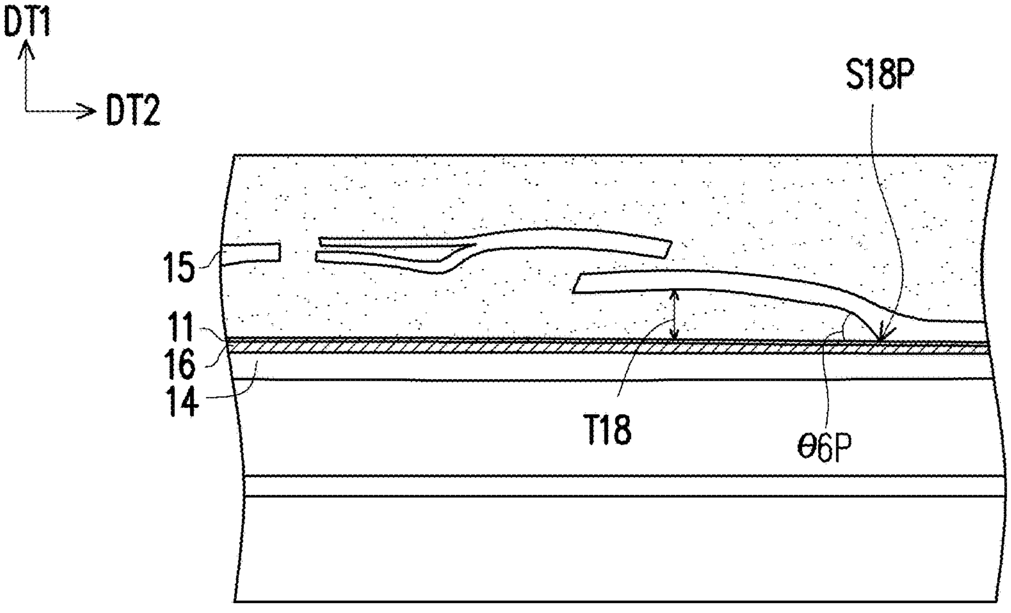

Referring to FIG. 7, FIG. 7A, and FIG. 7B, the main differences between an electronic device 1F and the electronic device 1E in FIG. 6, FIG. 6A and FIG. 6B are as follows.

In the electronic device 1F, the thickness T100 of the first substrate 100, the thickness T102 of the second substrate 102, and the thickness T104 of the intermediate layer 104 are, for example, 5.8 μm, 5.6 μm, and 1.3 μm in the order, but the disclosure is not limited thereto.

The first metal layer 11 is a single metal layer, and the thickness T1 of the first metal layer 11 is 91 nm, but the disclosure is not limited thereto. In some embodiments, the thickness T1 of the first metal layer 11 is the maximum thickness in the normal direction DT1, and a relatively flat portion may be selected for measurement. The second metal layer 16 includes three conductive layers, and the thicknesses of the three conductive layers along the normal direction DT1 are, for example, 100 nm, 660 nm, and 40 nm in the order, but the disclosure is not limited thereto. In some embodiments, the thicknesses of the three conductive layers of the second metal layer 16 respectively are the maximum thickness in the normal direction DT1, and a relatively flat portion may be selected for measurement. Similar to FIG. 3, the electronic device 1F may include the fourth metal layer 19 having the at least one pattern 19P. In the embodiment, the protrusion structure 12C does not overlap the pattern 19P in the normal direction DT1, but the disclosure is not limited thereto.

The related parameters of each film layer in FIG. 7, FIG. 7A, and FIG. 7B are listed in Table 6. However, note that the values in Table 6 only represent an embodiment under the framework of FIG. 7, but simple equivalent changes and modifications made in accordance with this specification or claims still fall within the scope of the disclosure.

TABLE 6

| Protrusion structure 12C ←--------------→ Inner protrusion structure 18C | | | | | |
|---|---|---|---|---|---|
| W1 | 50.62 μm | G | 60.10 μm | T18 | 3.12 μm |
| D1 | 41.09 μm | | | θ6P | 43.96° |
| D1' | 34.44 μm | | | | |
| D2' | 39.45 μm | | | | |
| D4 | 40.25 μm | | | | |
| D4N | 6.55 μm | | | | |
| D4P | 3.62 μm | | | | |
| G1 | 9.43 μm | | | | |
| G2 | 11.17 μm | | | | |
| T120-12 | 1.34 μm | | | | |
| T122-12 | 2.23 μm | | | | |
| T12 | 4.50 μm | | | | |
| θ1 | 23.20° | | | | |
| θ1' | 35.68° | | | | |
| θ2 | 32.91° | | | | |
| θ3 | 22.62° | | | | |

Figure 8:
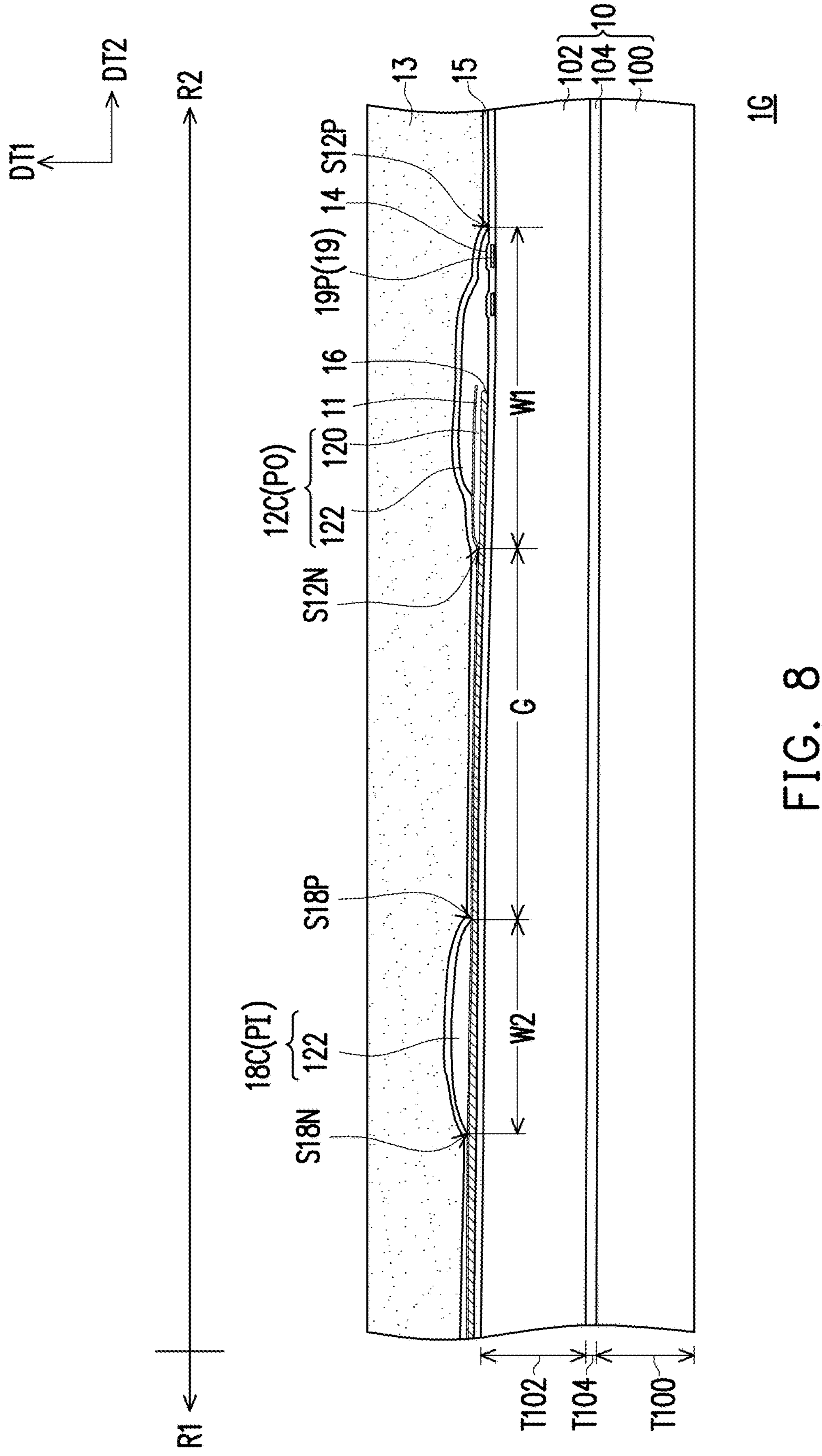
Figure 8A:
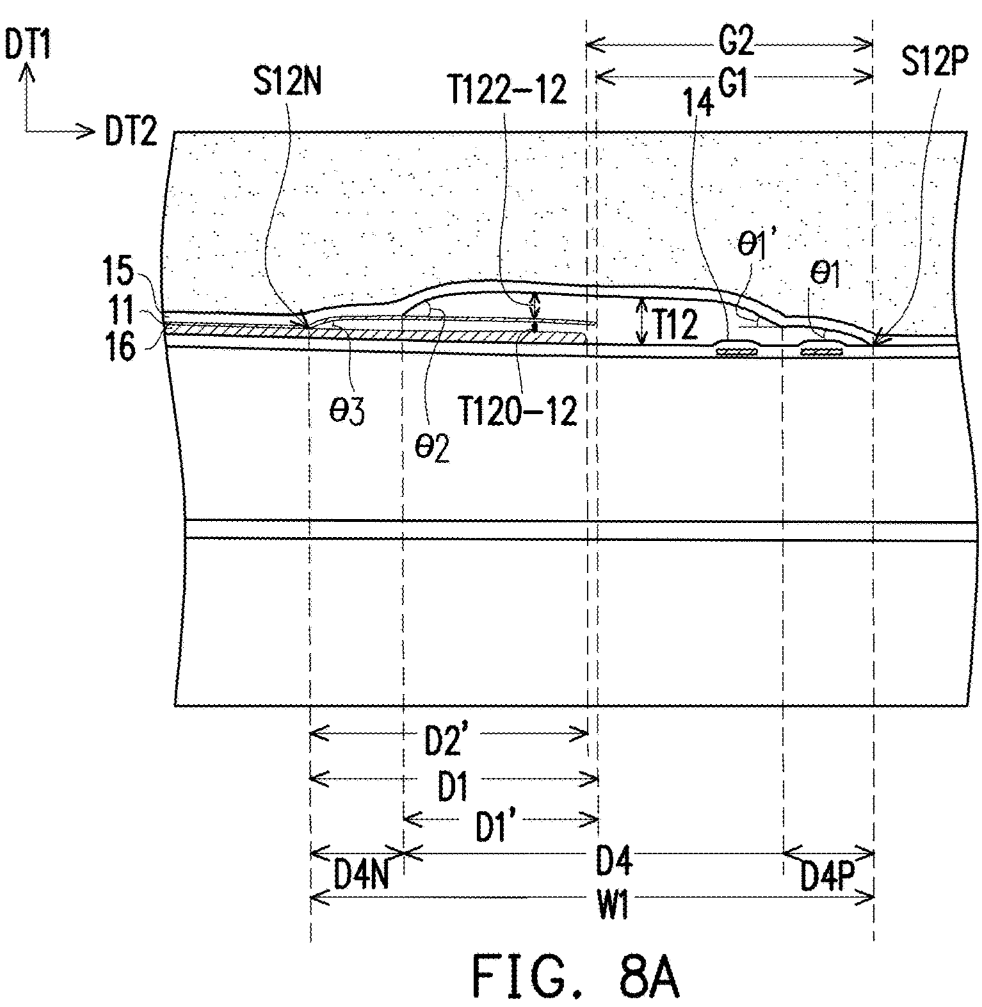
Figure 8B:
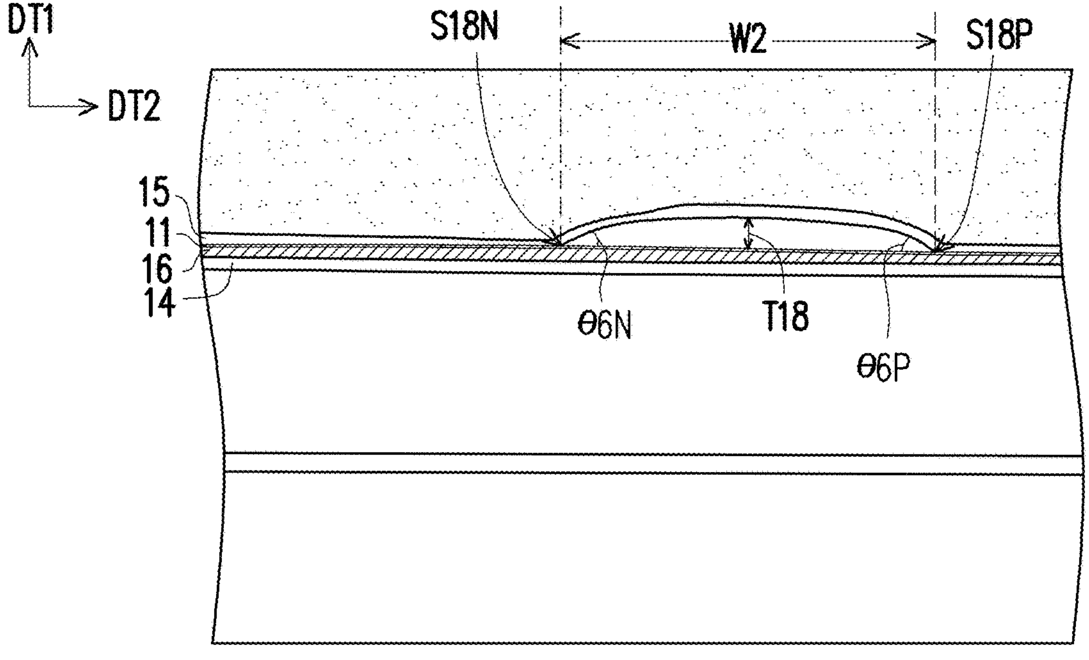

Referring to FIG. 8, FIG. 8A, and FIG. 8B, the main differences between an electronic device 1G and the electronic device 1D in FIG. 5, FIG. 5A, and FIG. 5B are as follows.

In the electronic device 1G, the thickness T100 of the first substrate 100, the thickness T102 of the second substrate 102, and the thickness T104 of the intermediate layer 104 are, for example, 9.3 μm, 9.5 μm, and 0.6 μm in the order, but the disclosure is not limited thereto.

The first metal layer 11 is a single metal layer, and the thickness T1 of the first metal layer 11 is 85 nm, but the disclosure is not limited thereto. In some embodiments, the thickness T1 of the first metal layer 11 is the maximum thickness in the normal direction DT1, and a relatively flat portion may be selected for measurement. The second metal layer 16 includes three conductive layers, and the thicknesses of the three conductive layers along the normal direction DT1 are, for example, 80 nm, 570 nm, and 20 nm in the order, but the disclosure is not limited thereto. Similar to FIG. 3, the electronic device 1C may include the fourth metal layer 19 having the plurality of the patterns 19P. In the embodiment, the protrusion structure 12C overlaps at least part of the patterns 19P in the normal direction DT1, but the disclosure is not limited thereto.

The related parameters of each film layer in FIG. 8, FIG. 8A, and FIG. 8B are listed in Table 7. However, note that the values in Table 7 only represent an embodiment under the framework of FIG. 8, but simple equivalent changes and modifications made in accordance with this specification or claims still fall within the scope of the disclosure.

TABLE 7

| Protrusion structure 12C ←--------------→ Inner protrusion structure 18C | | | | | |
|---|---|---|---|---|---|
| W1 | 58 μm | G | 72.2 μm | W2 | 40.00 μm |
| D1 | 32.60 μm | | | T18 | 3.60 μm |
| D1' | 23.00 μm | | | θ6N | 30.26° |
| D2' | 28.9 μm | | | θ6P | 29.48° |
| D4 | 38.8 μm | | | | |
| D4N | 9.20 μm | | | | |
| D4P | 10.10 μm | | | | |
| G1 | 25.10 μm | | | | |
| G2 | 29.50 μm | | | | |
| T120-12 | 1.10 μm | | | | |
| T122-12 | 2.50 μm | | | | |

TABLE 7-continued

| | Protrusion structure 12C ←--------------→ Inner protrusion structure 18C |
|---|---|
| T12 | 4.50 μm |
| θ1 | 17.05° |
| θ1' | 30.26° |
| θ2 | 27.65° |
| θ3 | 18.43° |

In the embodiments of the disclosure, the protrusion structure includes at least one organic insulating layer and is located in the peripheral region of the electronic device. The first metal layer extends into and ends in the protrusion structure, providing the first metal layer with proper protection and reducing the corrosion probability of the first metal layer, so that the electronic device has good display quality or electrical performance. In some embodiments, the electronic device may further satisfy $0.1 \leq G1/W1 \leq 0.9$ to improve the protection provided by the protrusion structure to the first metal layer. In some embodiments, the metal layer extending into the protrusion structure is covered by a plurality of organic insulating layers in the protrusion structure to reduce the corrosion probability of the metal layer. In some embodiments, covering the protrusion structure with a plurality of inorganic insulating layers contributes to improving the effect of blocking moisture and oxygen, thereby reducing the corrosion probability of the metal layer extending into the protrusion structure. In some embodiments, the plurality of inorganic insulating layers covering the protrusion structure may include the same or similar materials, so that there is no obvious interface between the plurality of inorganic insulating layers, thereby reducing moisture and oxygen invading from between the a plurality of inorganic insulating layers, and the corrosion probability of the metal layer extending into the protrusion structure may be reduced. In some embodiments, the second metal layer disposed between the inorganic insulating layer and the organic insulating layer may be farther from the outer edge S12P of the protrusion structure 12 than the first metal layer, so that the protection (the effect of blocking moisture and oxygen) of the second metal layer is improved. In some embodiments, the first metal layer may be separated into two parts in the inner protrusion structure, so that when the first metal layer in the protrusion structure is corroded, the probability of the corrosion spreading through the first metal layer to the display region is reduced.

The above embodiments are merely intended for describing the technical solutions of the disclosure rather than limiting the present disclosure. Although the disclosure is described in detail with reference to the foregoing embodiments, those of ordinary skill in the art should understand that they can still make modifications to the technical solutions described in the foregoing embodiments or make equivalent substitutions to some or all technical features thereof, without departing from scope of the technical solutions of the embodiments of the disclosure.

Although the disclosure has been described with reference to the above embodiments, it will be apparent to one of ordinary skill in the art that modifications, replacements, and changes to the described embodiments may be made without departing from the spirit and the scope of the disclosure. In addition, the features of multiple embodiments may be replaced, recombined, or mixed to form other embodiments. In addition, the protection scope of the disclosure is not limited to the process, machine, manufacturing, material composition, device, method, and step in specific embodiments described in the specification. Persons skilled in the art may understand the current or to-be-developed process, machine, manufacturing, material composition, device, method, and step from the content of the disclosure, which may be used according to the disclosure as long as the substantially same functions or substantially same results as in the embodiments described herein can be obtained. Therefore, the protection scope of the disclosure includes the foregoing process, machine, manufacturing, material composition, device, method, and step. In addition, each claim constitutes an individual embodiment, and the protection scope of the disclosure also includes a combination of the claims and embodiments. The protection scope of the disclosure should be determined based on the scope defined in the appended claims.

What is claimed is:

1. An electronic device having a peripheral region, comprising:

a substrate;

a protrusion structure disposed on the substrate and in the peripheral region, wherein the protrusion structure comprises a first organic insulating layer and a second organic insulating layer, and the first organic insulating layer is located between the second organic insulating layer and the substrate;

a first inorganic insulating layer disposed on the protrusion structure;

a second inorganic insulating layer disposed on first inorganic insulating layer, wherein the first inorganic insulating layer is disposed between the second inorganic insulating layer and the second organic insulating layer; and a third organic insulating layer disposed between the first inorganic insulating layer and the second inorganic insulating layer and comprising a first organic insulating pattern overlapped with an end portion of the protrusion structure, wherein in a cross-sectional view, the first organic insulating pattern of the third organic insulating layer is located in the peripheral region and comprises a top surface having a concave profile.

2. The electronic device according to claim 1, further comprising:

a conductive layer disposed between the substrate and the first organic insulating layer.

3. The electronic device according to claim 2, wherein an end of the conductive layer is located in the protrusion structure.

4. The electronic device according to claim 1, further comprising:

another protrusion structure adjacent to the protrusion structure and located in the peripheral region.

5. The electronic device according to claim 4, wherein the first organic insulating pattern of the third organic insulating layer is disposed between the protrusion structure and the another protrusion structure.

6. The electronic device according to claim 5, wherein the third organic insulating layer further comprises a second organic insulating pattern disposed between the protrusion structure and the another protrusion structure, located in the peripheral region, and overlapped with an end portion of the another protrusion structure.

7. The electronic device according to claim 6, wherein a top surface of the second organic insulating pattern of the third organic insulating layer has a concave profile.

8. The electronic device according to claim 1, further comprising:

a third inorganic insulating layer disposed between the substrate and the protrusion structure, wherein an included angle between the third inorganic insulating layer and the first inorganic insulating layer close to an outer edge of the protrusion structure is different from an included angle between the first inorganic insulating layer at a step-like descending edge of the protrusion structure and the substrate.

9. The electronic device according to claim 1, wherein a thickness of the first organic insulating layer is different from a thickness of the second organic insulating layer.

* * * * *